United States Patent
Folkmann et al.

(10) Patent No.: US 9,178,472 B2
(45) Date of Patent: Nov. 3, 2015

(54) BI-DIRECTIONAL POWER SUPPLY SIGNAL BASED LINEAR AMPLIFIER

(71) Applicant: RF Micro Devices, Inc., Greensboro, NC (US)

(72) Inventors: Andrew F. Folkmann, Cedar Rapids, IA (US); Nadim Khlat, Cugnaux (FR); Michael R. Kay, Summerfield, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/176,611

(22) Filed: Feb. 10, 2014

(65) Prior Publication Data

US 2014/0225674 A1 Aug. 14, 2014

Related U.S. Application Data

(60) Provisional application No. 61/762,445, filed on Feb. 8, 2013.

(51) Int. Cl.
*H03G 3/20* (2006.01)
*H03F 1/02* (2006.01)
*H03F 3/19* (2006.01)
(Continued)

(52) U.S. Cl.
CPC ............ *H03F 1/0222* (2013.01); *H03F 1/0227* (2013.01); *H03F 3/19* (2013.01); *H03F 3/21* (2013.01); *H03F 3/245* (2013.01); *H03F 2200/102* (2013.01); *H03F 2200/451* (2013.01)

(58) Field of Classification Search
CPC ....... H03F 1/0211; H03F 1/0216; H03G 3/20; H03G 3/00
USPC ................................... 330/127, 297, 285, 296
See application file for complete search history.

(56) References Cited

U.S. PATENT DOCUMENTS

| 3,969,682 A | 7/1976 | Rossum |
| 3,980,964 A | 9/1976 | Grodinsky |
| 4,587,552 A | 5/1986 | Chin |

(Continued)

FOREIGN PATENT DOCUMENTS

| CN | 1211355 A | 3/1999 |
| CN | 1898860 A | 1/2007 |

(Continued)

OTHER PUBLICATIONS

Non-Final Office Action for U.S. Appl. No. 12/836,307, mailed Sep. 25, 2014, 5 pages.

(Continued)

*Primary Examiner* — Henry Choe
(74) *Attorney, Agent, or Firm* — Withrow & Terranova, P.L.L.C.

(57) ABSTRACT

Circuitry, which includes a linear amplifier, is disclosed. The linear amplifier has a linear amplifier output and includes an input amplifier stage and an output amplifier stage. The output amplifier stage at least partially provides an envelope power supply voltage to a radio frequency (RF) power amplifier (PA) via an envelope power supply output using a selected one of a group of linear amplifier power supply signals. The group of linear amplifier power supply signals includes at least a first bi-directional power supply signal. The input amplifier stage selects the one of the group of linear amplifier power supply signals based on the envelope power supply voltage and a setpoint of the envelope power supply voltage.

27 Claims, 12 Drawing Sheets

(51) Int. Cl.
    *H03F 3/21*    (2006.01)
    *H03F 3/24*    (2006.01)

(56) References Cited

U.S. PATENT DOCUMENTS

| | | |
|---|---|---|
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow et al. |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,348,847 B2 | 3/2008 | Whittaker |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,856,048 B1 | 12/2010 | Smaini et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,717,100 B2 | 5/2014 | Reisner et al. |
| 8,718,582 B2 | 5/2014 | See et al. |
| 8,744,382 B2 | 6/2014 | Hou et al. |

(56) References Cited

U.S. PATENT DOCUMENTS

| | | |
|---|---|---|
| 8,824,978 B2 | 9/2014 | Briffa et al. |
| 8,829,993 B2 | 9/2014 | Briffa et al. |
| 8,909,175 B1 * | 12/2014 | McCallister ............ 455/114.3 |
| 8,947,162 B2 * | 2/2015 | Wimpenny et al. ........... 330/136 |
| 8,981,847 B2 | 3/2015 | Balteanu |
| 8,994,345 B2 | 3/2015 | Wilson |
| 2002/0071497 A1 | 6/2002 | Bengtsson et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0184794 A1 | 8/2007 | Drogi et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0082006 A1 | 3/2009 | Pozsgay et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0299647 A1 | 11/2012 | Honjo et al. |
| 2013/0024142 A1 | 1/2013 | Folkmann et al. |
| 2013/0034139 A1 | 2/2013 | Khlat et al. |
| 2013/0094553 A1 | 4/2013 | Paek et al. |
| 2013/0135043 A1 | 5/2013 | Hietala et al. |
| 2013/0141169 A1 * | 6/2013 | Khlat et al. ............ 330/297 |
| 2013/0147445 A1 * | 6/2013 | Levesque et al. ............ 323/271 |
| 2013/0169245 A1 | 7/2013 | Kay et al. |
| 2013/0214858 A1 | 8/2013 | Tournatory et al. |
| 2013/0229235 A1 | 9/2013 | Ohnishi |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 * | 1/2014 | Wimpenny ............ 327/318 |
| 2014/0028392 A1 * | 1/2014 | Wimpenny ............ 330/149 |

FOREIGN PATENT DOCUMENTS

| | | |
|---|---|---|
| CN | 101201891 A | 6/2008 |
| CN | 101416385 A | 4/2009 |
| CN | 101867284 A | 10/2010 |
| EP | 0755121 A2 | 1/1997 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |

(56) References Cited

FOREIGN PATENT DOCUMENTS

| | | | |
|---|---|---|---|
| EP | 2244366 A1 | 10/2010 | |
| EP | 2372904 A1 | 10/2011 | |
| EP | 2579456 A1 | 4/2013 | |
| GB | 2398648 A | 8/2004 | |
| GB | 2462204 A | 2/2010 | |
| GB | 2465552 A | 5/2010 | |
| GB | 2484475 A | 4/2012 | |
| TW | 461168 B | 10/2001 | |
| WO | 0048306 A1 | 8/2000 | |
| WO | 2004002006 A1 | 12/2003 | |
| WO | 2004082135 A2 | 9/2004 | |
| WO | 2005013084 A2 | 2/2005 | |
| WO | 2006021774 A1 | 3/2006 | |
| WO | 2006070319 A1 | 7/2006 | |
| WO | 2006073208 A1 | 7/2006 | |
| WO | 2007107919 A1 | 9/2007 | |
| WO | 2007149346 A2 | 12/2007 | |
| WO | 2012151594 A2 | 11/2012 | |
| WO | 2012172544 A1 | 12/2012 | |

OTHER PUBLICATIONS

Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Extended European Search Report for European Patent Application No. 12794149.0, issued Oct. 29, 2014, 6 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Notice of Allowance for U.S. Appl. No. 14/072,140, mailed Dec. 2, 2014, 8 pages.
First Office Action for Chinese Patent Application No. 2012800265590, issued Nov. 3, 2014, 14 pages (with English translation).
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Final Office Action for U.S. Appl. No. 13/297,470, mailed Oct. 25, 2013, 17 pages.
Non-Final Office Action for U.S. Appl. No. 13/297,470, mailed Feb. 20, 2014, 16 pages.
International Search Report for PCT/US2011/061009, mailed Feb. 8, 2012, 14 pages.
International Preliminary Report on Patentability for PCT/US2011/061009, mailed May 30, 2013, 10 pages.
Notice of Allowance for U.S. Appl. No. 14/022,858, mailed Oct. 25, 2013, 9 pages.
Notice of Allowance for U.S. Appl. No. 14/022,858, mailed May 27, 2014, 6 pages.
Notice of Allowance for U.S. Appl. No. 13/343,840, mailed Jul. 1, 2013, 8 pages.
International Search Report for PCT/US2012/023495, mailed May 7, 2012, 13 pages.
International Preliminary Report on Patentability for PCT/US2012/023495, mailed Aug. 15, 2013, 10 pages.
Notice of Allowance for U.S. Appl. No. 13/363,888, mailed Jul. 18, 2013, 9 pages.
Non-final Office Action for U.S. Appl. No. 13/222,453, mailed Dec. 6, 2012, 13 pages.
Notice of Allowance for U.S. Appl. No. 13/222,453, mailed Feb. 21, 2013, 7 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Non-Final Office Action for U.S. Appl. No. 13/367,973, mailed Apr. 25, 2014, 5 pages.
Invitation to Pay Additional Fees and Where Applicable Protest Fee for PCT/US2012/024124, mailed Jun. 1, 2012, 7 pages.
International Search Report for PCT/US2012/024124, mailed Aug. 24, 2012, 14 pages.
International Preliminary Report on Patentability for PCT/US2012/024124, mailed Aug. 22, 2013, 8 pages.
Non-Final Office Action for U.S. Appl. No. 13/423,649, mailed May 22, 2013, 7 pages.
Notice of Allowance for U.S. Appl. No. 13/423,649, mailed Aug. 30, 2013, 8 pages.
Notice of Allowance for U.S. Appl. No. 14/072,140, mailed Aug. 27, 2014, 8 pages.
Notice of Allowance for U.S. Appl. No. 13/316,229, mailed Nov. 14, 2012, 9 pages.
Notice of Allowance for U.S. Appl. No. 13/316,229, mailed Aug. 29, 2013, 8 pages.
International Search Report for PCT/US2011/064255, mailed Apr. 3, 2012, 12 pages.
International Preliminary Report on Patentability for PCT/US2011/064255, mailed Jun. 20, 2013, 7 pages.
Non-Final Office Action for U.S. Appl. No. 14/072,225, mailed Aug. 15, 2014, 4 pages.
International Search Report for PCT/US2012/40317, mailed Sep. 7, 2012, 7 pages.
International Preliminary Report on Patentability for PCT/US2012/040317, mailed Dec. 12, 2013, 5 pages.
Non-Final Office Action for U.S. Appl. No. 13/486,012, mailed Jul. 28, 2014, 7 pages.
Quayle Action for U.S. Appl. No. 13/531,719, mailed Oct. 10, 2013, 5 pages.
Notice of Allowance for U.S. Appl. No. 13/531,719, mailed Dec. 30, 2013, 7 pages.
Notice of Allowance for U.S. Appl. No. 13/548,283, mailed Sep. 3, 2014, 7 pages.
Non-Final Office Action for U.S. Appl. No. 13/550,049, mailed Nov. 25, 2013, 6 pages.
Notice of Allowance for U.S. Appl. No. 13/550,049, mailed Mar. 6, 2014, 5 pages.
International Search Report for PCT/US2012/046887, mailed Dec. 21, 2012, 12 pages.
International Preliminary Report on Patentability for PCT/US2012/046887, mailed Jan. 30, 2014, 8 pages.
Notice of Allowance for U.S. Appl. No. 13/550,060, mailed Aug. 16, 2013, 8 pages.
Non-final Office Action for U.S. Appl. No. 13/222,484, mailed Nov. 8, 2012, 9 pages.
Final Office Action for U.S. Appl. No. 13/222,484, mailed Apr. 10, 2013, 10 pages.
Advisory Action for U.S. Appl. No. 13/222,484, mailed Jun. 14, 2013, 3 pages.

(56) References Cited

OTHER PUBLICATIONS

Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Search Report and Written Opinion for PCT/US2012/053654, mailed Feb. 15, 2013, 11 pages.
International Preliminary Report on Patentability for PCT/US2012/053654, mailed Mar. 13, 2014, 7 pages.
Non-Final Office Action for U.S. Appl. No. 13/647,815, mailed May 2, 2014, 6 pages.
Non-Final Office Action for U.S. Appl. No. 13/689,883, mailed Mar. 27, 2014, 13 pages.
Non-Final Office Action for U.S. Appl. No. 13/689,883, mailed Aug. 27, 2014, 12 pages.
International Search Report and Written Opinion for PCT/US2012/062070, mailed Jan. 21, 2013, 12 pages.
International Preliminary Report on Patentability for PCT/US2012/062070, mailed May 8, 2014, 8 pages.
Non-Final Office Action for U.S. Appl. No. 13/661,552, mailed Feb. 21, 2014, 5 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html?cmp_ids=71&news_ids=222901746.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mmA^2 at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
Non-final Office Action for U.S. Appl. No. 11/113,873, now Patent No. 7,773,691, mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619, mailed May 8, 2007, 2 pages.
Extended European Search Report for application 06740532.4, mailed Dec. 7, 2010, 7 pages.
Non-final Office Action for U.S. Appl. No. 12/112,006, mailed Apr. 5, 2010, 6 pages.
Notice of Allowance for U.S. Appl. No. 12/112,006, mailed Jul. 19, 2010, 6 pages.
Non-Final Office Action for U.S. Appl. No. 12/836,307, mailed Nov. 5, 2013, 6 pages.
Notice of Allowance for U.S. Appl. No. 12/836,307, mailed May 5, 2014, 6 pages.
Non-final Office Action for U.S. Appl. No. 13/089,917, mailed Nov. 23, 2012, 6 pages.
Examination Report for European Patent Application No. 11720630, mailed Aug. 16, 2013, 5 pages.
Examination Report for European Patent Application No. 11720630.0, issued Mar. 18, 2014, 4 pages.
European Search Report for European Patent Application No. 14162682.0, issued Aug. 27, 2014, 7 pages.
International Search Report for PCT/US11/033037, mailed Aug. 9, 2011, 10 pages.
International Preliminary Report on Patentability for PCT/US2011/033037, mailed Nov. 1, 2012, 7 pages.
Non-Final Office Action for U.S. Appl. No. 13/188,024, mailed Feb. 5, 2013, 8 pages.
Notice of Allowance for U.S. Appl. No. 13/188,024, mailed Jun. 18, 2013, 8 pages.
International Search Report for PCT/US2011/044857, mailed Oct. 24, 2011, 10 pages.
International Preliminary Report on Patentability for PCT/US2011/044857, mailed Mar. 7, 2013, 6 pages.
Non-final Office Action for U.S. Appl. No. 13/218,400, mailed Nov. 8, 2012, 7 pages.
Notice of Allowance for U.S. Appl. No. 13/218,400, mailed Apr. 11, 2013, 7 pages.
International Search Report for PCT/US11/49243, mailed Dec. 22, 2011, 9 pages.
International Preliminary Report on Patentability for PCT/US11/49243, mailed Nov. 13, 2012, 33 pages.

(56) References Cited

OTHER PUBLICATIONS

International Search Report for PCT/US2011/054106, mailed Feb. 9, 2012, 11 pages.
International Preliminary Report on Patentability for PCT/US2011/054106, mailed Apr. 11, 2013, 8 pages.
Notice of Allowance for U.S. Appl. No. 13/297,490, mailed Feb. 27, 2014, 7 pages.
Invitation to Pay Additional Fees for PCT/US2011/061007, mailed Feb. 13, 2012, 7 pages.
International Search Report for PCT/US2011/061007, mailed Aug. 16, 2012, 16 pages.
International Preliminary Report on Patentability for PCT/US2011/061007, mailed May 30, 2013, 11 pages.
Non-Final Office Action for U.S. Appl. No. 13/297,470, mailed May 8, 2013, 15 pages.
Notice of Allowance for U.S. Appl. No. 13/948,291, mailed Feb. 11, 2015, 7 pages.
First Office Action for Chinese Patent Application No. 2011800302735, issued Dec. 3, 2014, 15 pages (with English translation).
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
International Preliminary Report on Patentability for PCT/US2013/052277, mailed Feb. 5, 2015, 9 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
Notice of Allowance for U.S. Appl. No. 13/661,552, mailed Jun. 13, 2014, 5 pages.
International Search Report and Written Opinion for PCT/US2012/062110, issued Apr. 8, 2014, 12 pages.
International Preliminary Report on Patentability for PCT/US2012/062110, mailed May 8, 2014, 9 pages.
Non-Final Office Action for U.S. Appl. No. 13/692,084, mailed Apr. 10, 2014, 6 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
International Search Report and Written Opinion for PCT/US2012/067230, mailed Feb. 21, 2013, 10 pages.
International Preliminary Report on Patentability and Written Opinion for PCT/US2012/067230, mailed Jun. 12, 2014, 7 pages.
Non-Final Office Action for U.S. Appl. No. 13/684,826, mailed Apr. 3, 2014, 5 pages.
Notice of Allowance for U.S. Appl. No. 13/684,826, mailed Jul. 18, 2014, 7 pages.
Non-Final Office Action for U.S. Appl. No. 14/022,940, mailed Dec. 20, 2013, 5 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/782,142, mailed Sep. 4, 2014, 6 pages.
Non-Final Office Action for U.S. Appl. No. 13/951,976, mailed Apr. 4, 2014, 7 pages.
International Search Report and Written Opinion for PCT/US2013/052277, mailed Jan. 7, 2014, 14 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
European Search Report for European Patent Application No. 14190851.7, issued Mar. 5, 2015, 6 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
European Examination Report for European Patent Application No. 14162682.0, mailed May 22, 2015, 5 pages.
International Preliminary Report on Patentability for PCT/US2013/065403, mailed Apr. 30, 2015, 8 pages.
Corrected Notice of Allowance for U.S. Appl. No. 13/297,470, mailed Jun. 5, 2015, 11 pages.
Advisory Action for U.S. Appl. No. 13/689,883, mailed Apr. 20, 2015, 3 pages.
Advisory Action for U.S. Appl. No. 13/661,227, mailed May 12, 2015, 3 pages.
Advisory Action for U.S. Appl. No. 13/714,600, mailed May 26, 2015, 3 pages.
Notice of Allowance for U.S. Appl. No. 13/747,725, mailed May 13, 2015, 9 pages.
Notice of Allowance for U.S. Appl. No. 13/747,749, mailed Jun. 4, 2015, 8 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Non-Final Office Action for U.S. Appl. No. 14/082,629, mailed Jun. 18, 2015, 15 pages.
Quayle Action for U.S. Appl. No. 13/689,940, mailed May 14, 2015, 7 pages.
Notice of Allowance for U.S. Appl. No. 13/661,164, mailed Jun. 3, 2015, 6 pages.
Notice of Allowance for U.S. Appl. No. 13/948,291, mailed Jul. 17, 2015, 8 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.

* cited by examiner

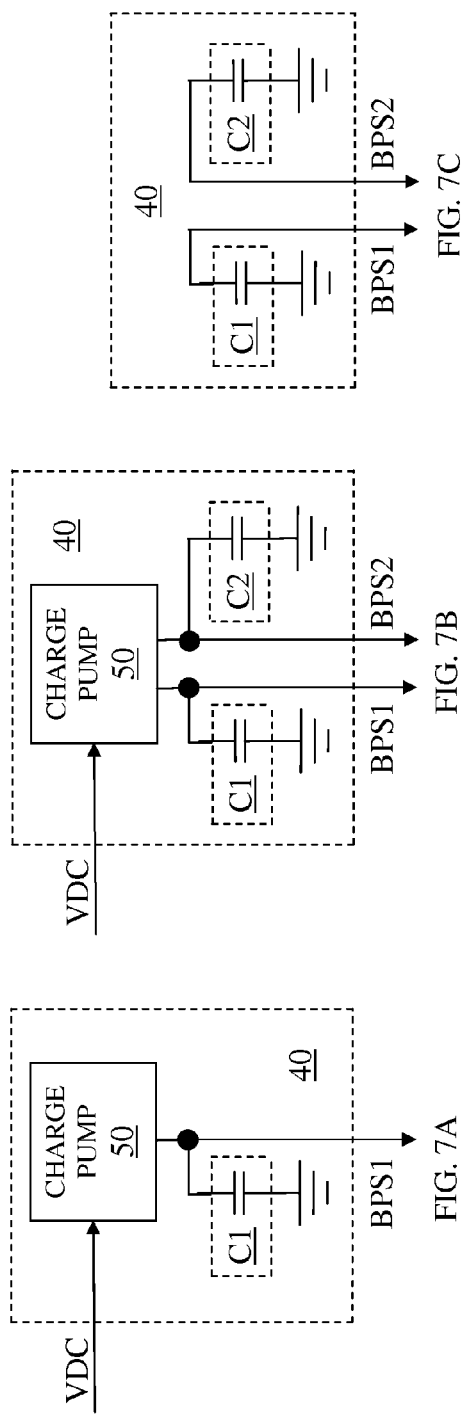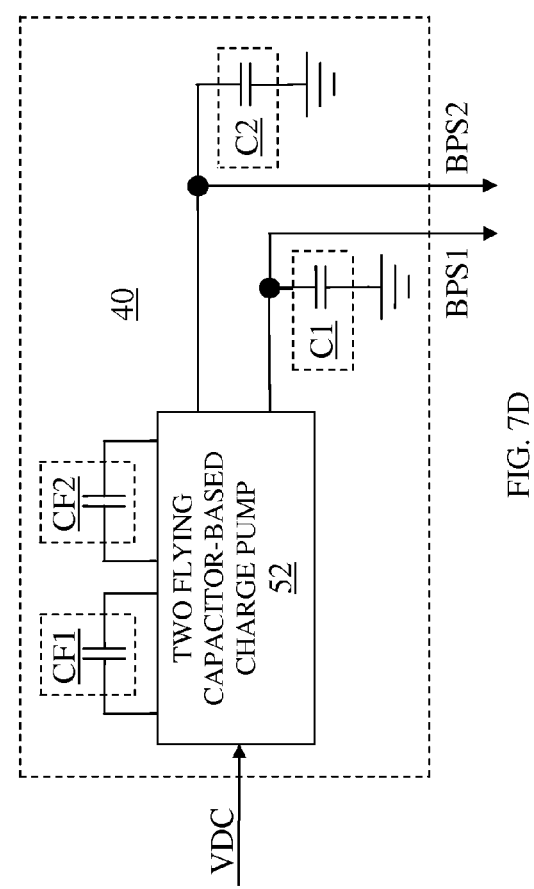

BI-DIRECTIONAL POWER SUPPLY SIGNAL BASED LINEAR AMPLIFIER

RELATED APPLICATIONS

This application claims the benefit of U.S. provisional patent application No. 61/762,445, filed Feb. 8, 2013, the disclosure of which is incorporated herein by reference in its entirety.

FIELD OF THE DISCLOSURE

Embodiments of the present disclosure relate to linear amplifier based power supplies and radio frequency (RF) power amplifiers, both of which may be used in RF communication systems.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, and efficient as is practical. Thus, there is a need for RF circuitry in a communications device that is low cost, small, simple, and efficient.

SUMMARY

Circuitry, which includes a linear amplifier, is disclosed according to one embodiment of the present disclosure. The linear amplifier has a linear amplifier output and includes an input amplifier stage and an output amplifier stage. The output amplifier stage at least partially provides an envelope power supply voltage to a radio frequency (RF) power amplifier (PA) via an envelope power supply output using a selected one of a group of linear amplifier power supply signals. The group of linear amplifier power supply signals includes at least a first bi-directional power supply signal. The input amplifier stage selects the one of the group of linear amplifier power supply signals based on the envelope power supply voltage and a setpoint of the envelope power supply voltage.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 7A shows details of the linear amplifier power supply illustrated in FIG. 5 according to one embodiment of the linear amplifier power supply.

FIGS. 7B, 7C, and 7D show details of the linear amplifier power supply illustrated in FIG. 5 according to three different embodiment of the linear amplifier power supply, respectively.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Circuitry, which includes a linear amplifier, is disclosed according to one embodiment of the present disclosure. The linear amplifier has a linear amplifier output and includes an input amplifier stage and an output amplifier stage. The output amplifier stage at least partially provides an envelope power supply voltage to a radio frequency (RF) power amplifier (PA) via an envelope power supply output using a selected one of a group of linear amplifier power supply signals. The group of linear amplifier power supply signals includes at least a first bi-directional power supply signal. The input amplifier stage selects the one of the group of linear amplifier power supply signals based on the envelope power supply voltage and a setpoint of the envelope power supply voltage.

Figure 1:
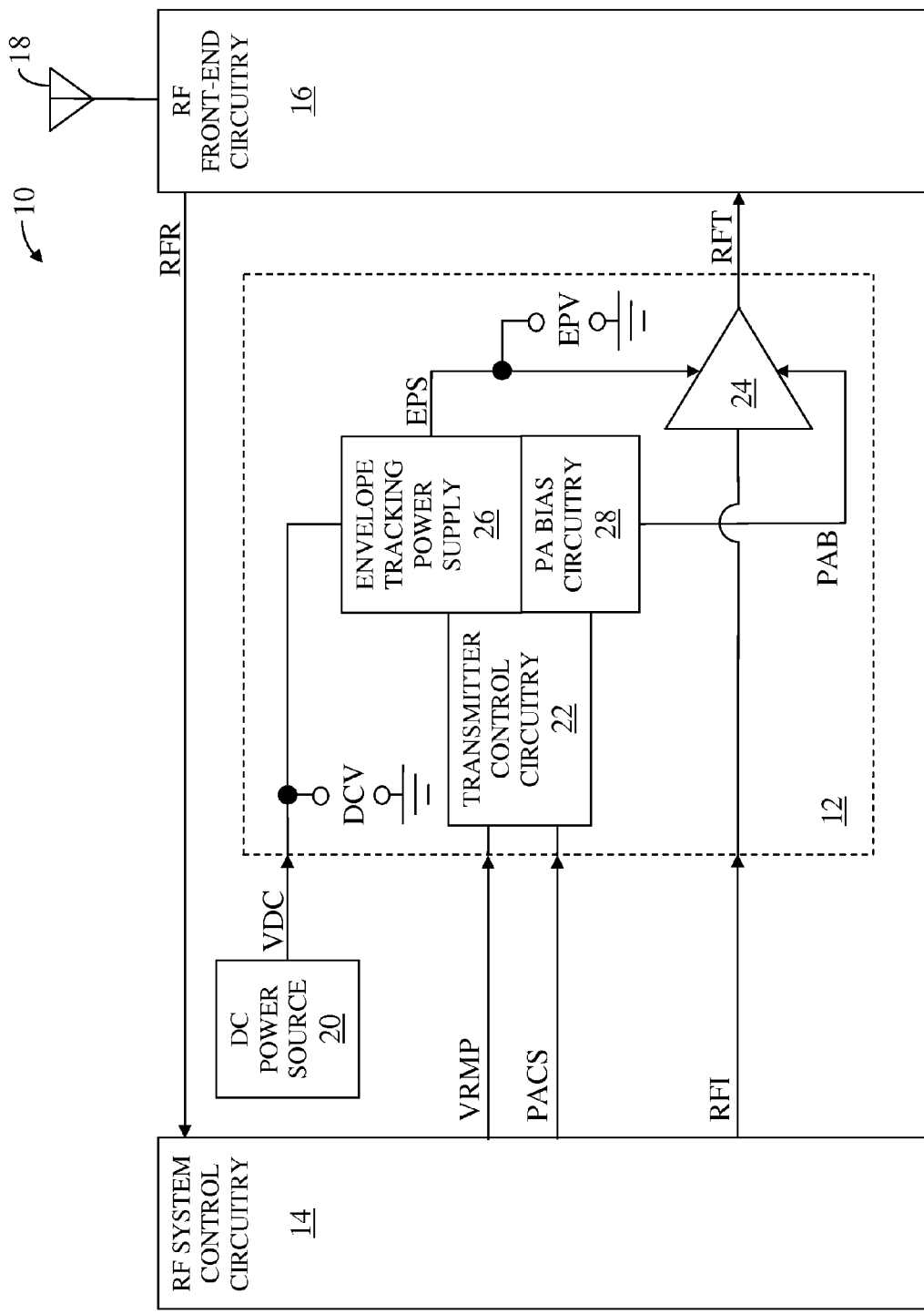
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20. The RF transmitter circuitry 12 includes transmitter control circuitry 22, an RF PA 24, an envelope tracking power supply 26, and PA bias circuitry 28.

In one embodiment of the RF communications system 10, the RF front-end circuitry 16 receives via the RF antenna 18, processes, and forwards an RF receive signal RFR to the RF system control circuitry 14. The RF system control circuitry 14 provides an envelope power supply control signal VRMP and a transmitter configuration signal PACS to the transmitter control circuitry 22. The RF system control circuitry 14 provides an RF input signal RFI to the RF PA 24. The DC power source 20 provides a DC source signal VDC to the envelope tracking power supply 26. The DC source signal VDC has a DC source voltage DCV. In one embodiment of the DC power source 20, the DC power source 20 is a battery.

The transmitter control circuitry 22 is coupled to the envelope tracking power supply 26 and to the PA bias circuitry 28. The envelope tracking power supply 26 provides an envelope power supply signal EPS to the RF PA 24 based on the envelope power supply control signal VRMP. The envelope power supply signal EPS has an envelope power supply voltage EPV. The DC source signal VDC provides power to the envelope tracking power supply 26. As such, the envelope power supply signal EPS is based on the DC source signal VDC. The envelope power supply control signal VRMP is representative of a setpoint of the envelope power supply signal EPS. In one embodiment of the envelope power supply control signal VRMP, the envelope power supply control signal VRMP is representative of a setpoint of the envelope power supply voltage EPV. The RF PA 24 receives and amplifies the RF input signal RFI to provide an RF transmit signal RFT using the envelope power supply signal EPS. The envelope power supply signal EPS provides power for amplification. In one embodiment of the RF PA 24, the RF PA 24 receives and amplifies the RF input signal RFI to provide the RF transmit signal RFT using the envelope power supply voltage EPV. The envelope power supply voltage EPV provides power for amplification.

The RF front-end circuitry 16 receives, processes, and transmits the RF transmit signal RFT via the RF antenna 18. In one embodiment of the RF transmitter circuitry 12, the transmitter control circuitry 22 configures the RF transmitter circuitry 12 based on the transmitter configuration signal PACS. In this regard, in one embodiment of the RF communications system 10, the RF communications system 10 communicates with other RF communications systems (not shown) using multiple communications slots, which may include transmit communications slots, receive communications slots, simultaneous receive and transmit communications slots, or any combination thereof. Such communications slots may utilize the RF transmit signal RFT, the RF receive signal RFR, other RF signals (not shown), or any combination thereof. In one embodiment of an RF communications slot, the RF communications slot is a time period during which RF transmissions, RF receptions, or both, may occur. Adjacent RF communications slots may be separated by slot boundaries, in which RF transmissions, RF receptions, or both, may be prohibited. As a result, during the slot boundaries, the RF communications system 10 may prepare for RF transmissions, RF receptions, or both.

The PA bias circuitry 28 provides a PA bias signal PAB to the RF PA 24. In this regard, the PA bias circuitry 28 biases the RF PA 24 via the PA bias signal PAB. In one embodiment of the PA bias circuitry 28, the PA bias circuitry 28 biases the RF PA 24 based on the transmitter configuration signal PACS. In one embodiment of the RF front-end circuitry 16, the RF front-end circuitry 16 includes at least one RF switch, at least one RF amplifier, at least one RF filter, at least one RF duplexer, at least one RF diplexer, the like, or any combination thereof. In one embodiment of the RF system control circuitry 14, the RF system control circuitry 14 is RF transceiver circuitry, which may include an RF transceiver IC, baseband controller circuitry, the like, or any combination thereof.

Figure 2:
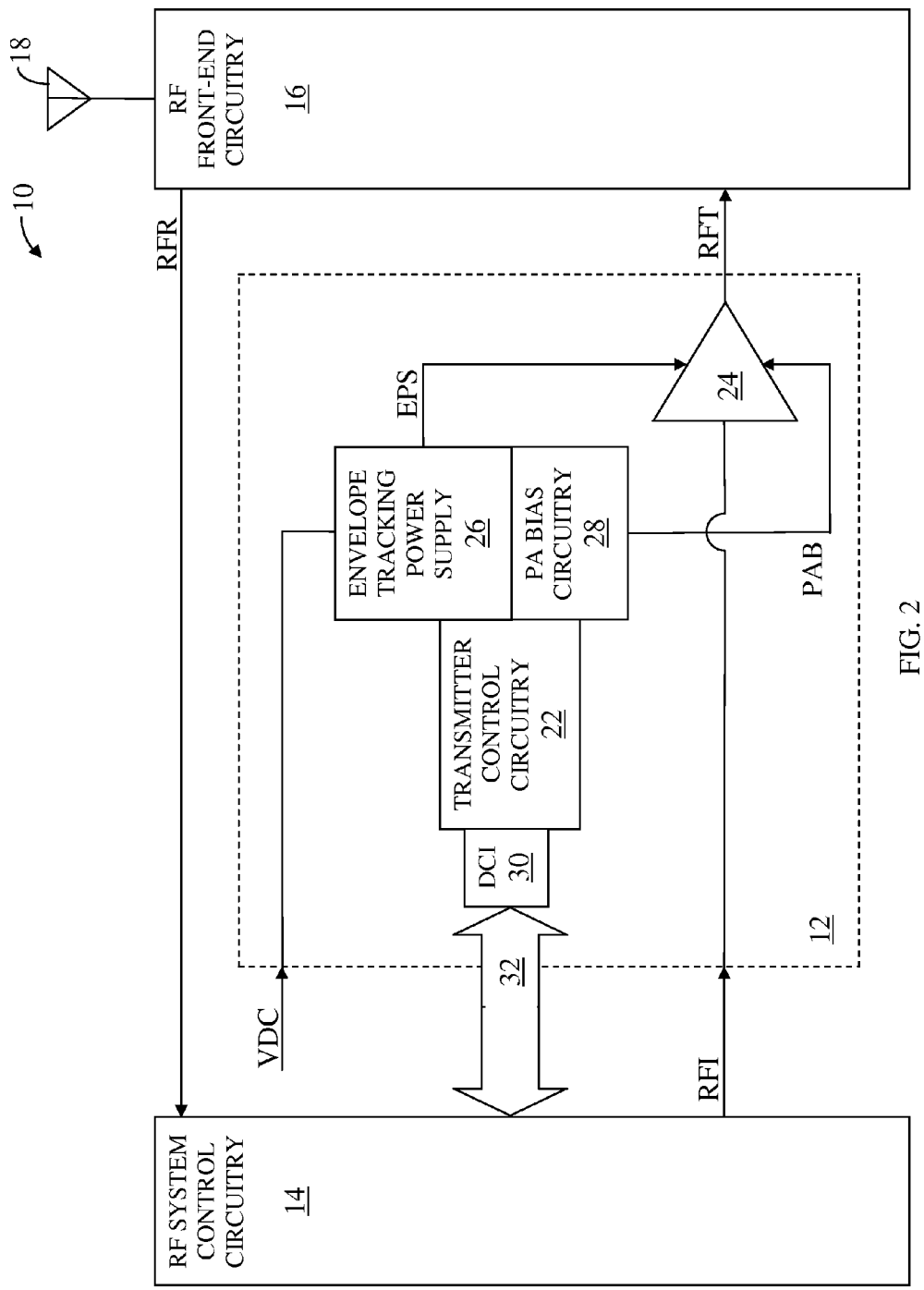
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1, except in the RF communications system 10 illustrated in FIG. 2, the RF transmitter circuitry 12 further includes a digital communications interface 30, which is coupled between the transmitter control circuitry 22 and a digital communications bus 32. The digital communications bus 32 is also coupled to the RF system control circuitry 14. As such, the RF system control circuitry 14 provides the envelope power supply control signal VRMP (FIG. 1) and the transmitter configuration signal PACS (FIG. 1) to the transmitter control circuitry 22 via the digital communications bus 32 and the digital communications interface 30.

Figure 3:
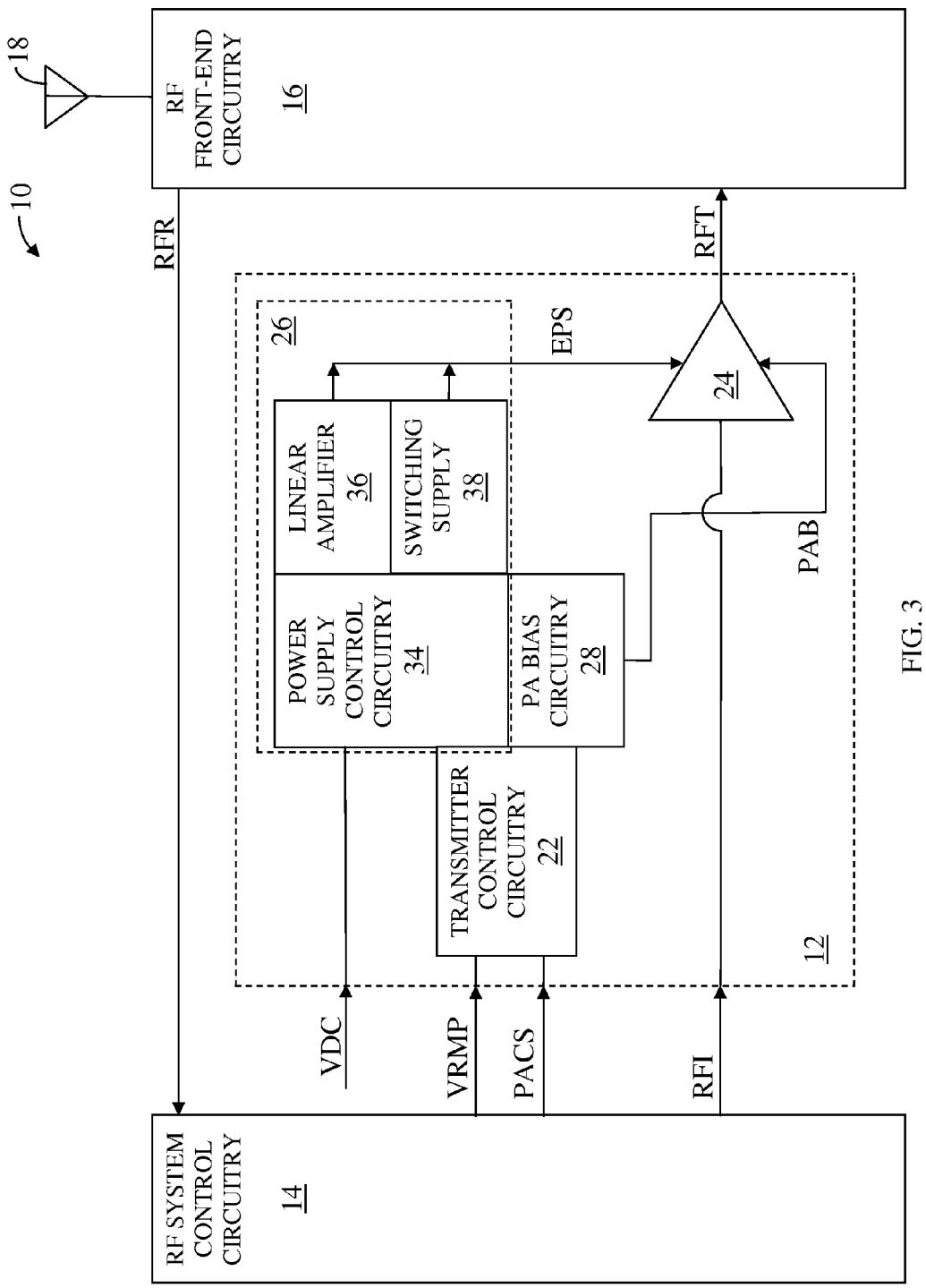
FIG. 3 shows details of an envelope tracking power supply illustrated in FIG. 1 according to one embodiment of the envelope tracking power supply.

FIG. 3 shows details of the envelope tracking power supply 26 illustrated in FIG. 1 according to one embodiment of the envelope tracking power supply 26. The envelope tracking power supply 26 includes power supply control circuitry 34, a linear amplifier 36, and a switching supply 38. The power supply control circuitry 34 is coupled to the transmitter control circuitry 22, the linear amplifier 36 is coupled to the power supply control circuitry 34, and the switching supply 38 is coupled to the power supply control circuitry 34. The transmitter control circuitry 22 may forward the envelope power supply control signal VRMP to the power supply control circuitry 34.

Since the envelope power supply control signal VRMP is representative of the setpoint of the envelope power supply signal EPS, the power supply control circuitry 34 controls the linear amplifier 36 and the switching supply 38 based on the setpoint of the envelope power supply signal EPS. The linear amplifier 36 and the switching supply 38 provide the envelope power supply signal EPS, such that the linear amplifier 36 partially provides the envelope power supply signal EPS and the switching supply 38 partially provides the envelope power supply signal EPS. The switching supply 38 may provide power more efficiently than the linear amplifier 36. However, the linear amplifier 36 may provide the envelope power supply signal EPS more accurately than the switching supply 38. As such, the linear amplifier 36 regulates the envelope power supply voltage EPV (FIGS. 1 and 6) based on the setpoint of the envelope power supply voltage EPV (FIGS. 1 and 6), and the switching supply 38 operates to drive an output current from the linear amplifier 36 toward zero to maximize efficiency. In this regard, the linear amplifier 36 behaves like a voltage source and the switching supply 38 behaves like a current source.

Figure 6:
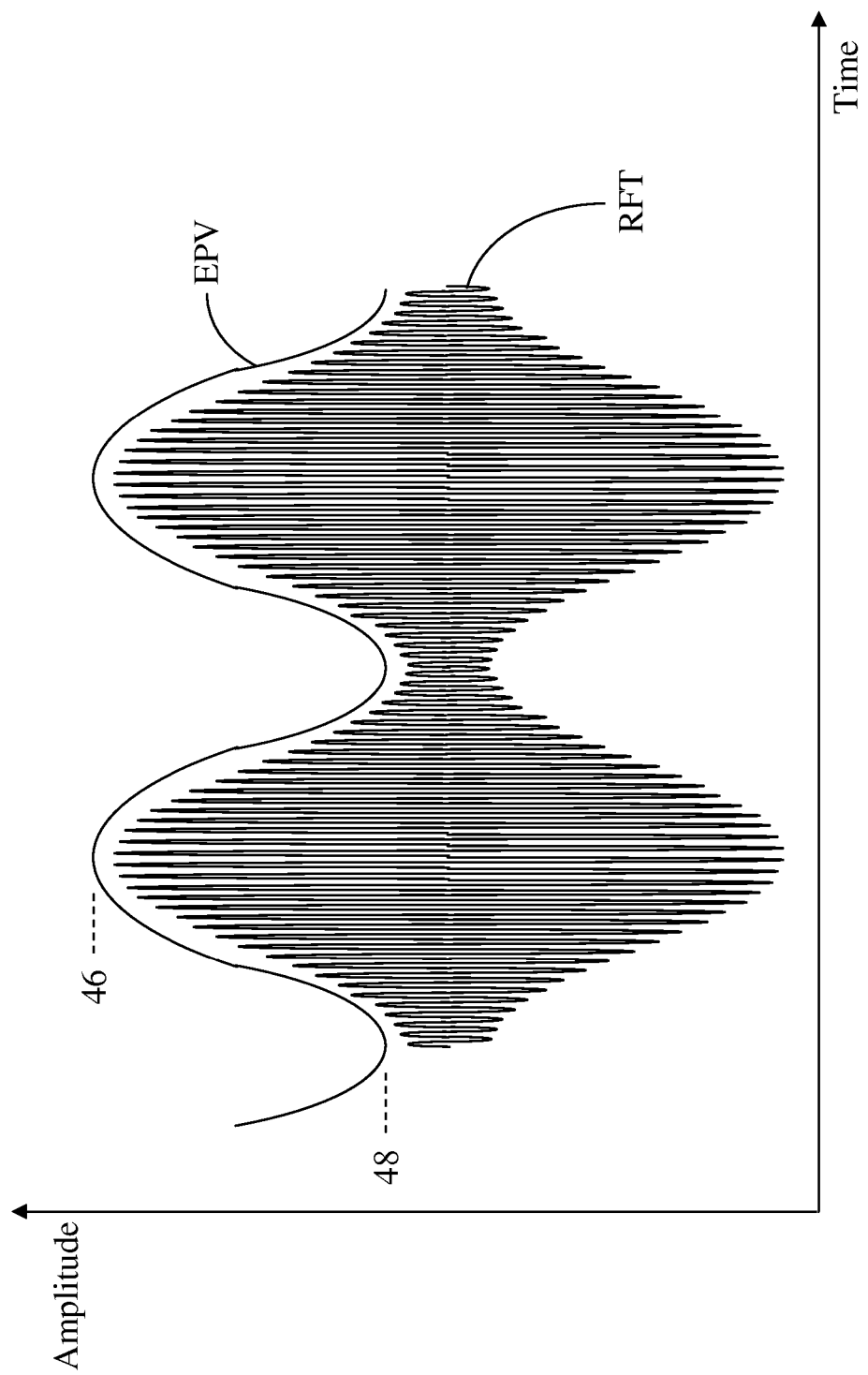
FIG. 6 is a graph illustrating an RF transmit signal and an envelope power supply voltage shown in FIGS. 1 and 4, respectively, according to one embodiment of the RF transmit signal and the envelope power supply voltage.

As previously mentioned, in one embodiment of the RF communications system 10, the RF PA 24 receives and amplifies the RF input signal RFI to provide the RF transmit signal RFT using the envelope power supply signal EPS, which provides power for amplification. In one embodiment of the RF input signal RFI, the RF input signal RFI is amplitude modulated. As such, the RF transmit signal RFT is also amplitude modulated, as illustrated in FIG. 6. Since the amplitude of the RF transmit signal RFT is modulated, the amplitude of the RF transmit signal RFT traverses within an envelope of the RF transmit signal RFT. For proper operation of the RF PA 24, the envelope power supply voltage EPV (FIGS. 1 and 6) must be high enough to accommodate the envelope of the RF transmit signal RFT. However, to increase efficiency in the RF PA 24, the envelope power supply voltage EPV (FIGS. 1 and 6) may at least partially track the envelope of the RF transmit signal RFT. This tracking by the envelope power supply voltage EPV is called envelope tracking.

In this regard, since the envelope power supply control signal VRMP is representative of the setpoint of the envelope power supply signal EPS, the envelope power supply control signal VRMP may be received and amplitude modulated to provide at least partial envelope tracking of the RF transmit signal RFT by causing the envelope power supply voltage EPV (FIGS. 1 and 6) to be amplitude modulated.

In a first embodiment of the envelope power supply control signal VRMP, a bandwidth of the envelope power supply control signal VRMP is greater than about 10 megahertz. In a second embodiment of the envelope power supply control signal VRMP, the bandwidth of the envelope power supply control signal VRMP is greater than about 20 megahertz. In a third embodiment of the envelope power supply control signal VRMP, the bandwidth of the envelope power supply control signal VRMP is greater than about 30 megahertz. In a fourth embodiment of the envelope power supply control signal VRMP, the bandwidth of the envelope power supply control signal VRMP is greater than about 40 megahertz. In a fifth embodiment of the envelope power supply control signal VRMP, the bandwidth of the envelope power supply control signal VRMP is greater than about 50 megahertz. In an alternate embodiment of the envelope power supply control signal VRMP, the bandwidth of the envelope power supply control signal VRMP is less than about 100 megahertz.

Figure 4:
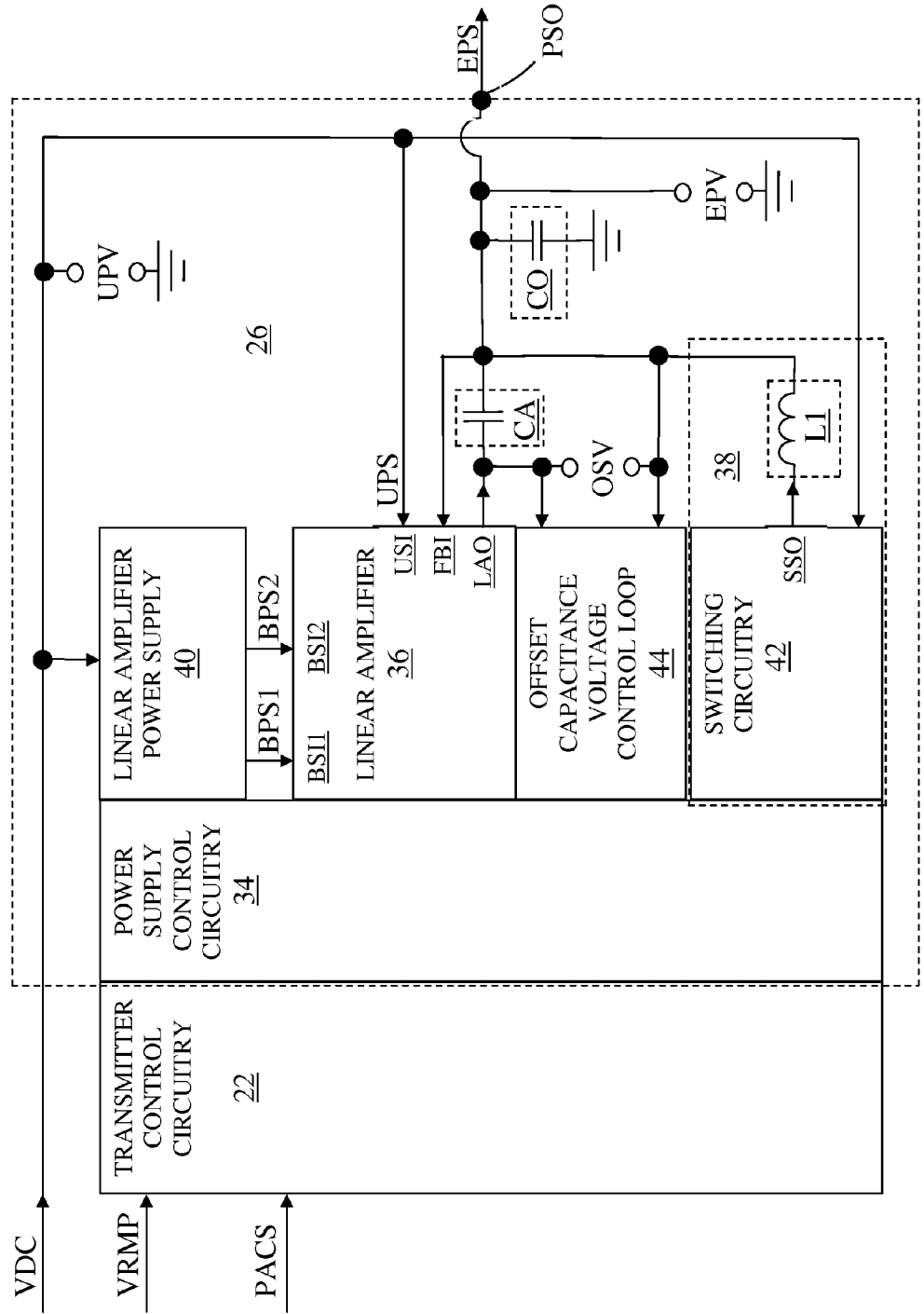
FIG. 4 shows details of the envelope tracking power supply illustrated in FIG. 1 according to an alternate embodiment of the envelope tracking power supply.

FIG. 4 shows details of the envelope tracking power supply 26 illustrated in FIG. 1 according to an alternate embodiment of the envelope tracking power supply 26. The envelope tracking power supply 26 illustrated in FIG. 4 is similar to the envelope tracking power supply 26 illustrated in FIG. 3, except the envelope tracking power supply 26 illustrated in FIG. 4 further includes a linear amplifier power supply 40, an offset capacitance voltage control loop 44, an offset capacitive element CA, and an output filter capacitive element CO. Additionally, the switching supply 38 includes switching circuitry 42 and a first inductive element L1. The envelope tracking power supply 26 has an envelope power supply output PSO, such that the envelope power supply signal EPS is provided via the envelope power supply output PSO. As previously mentioned, the envelope power supply signal EPS has the envelope power supply voltage EPV.

The linear amplifier 36 has a feedback input FBI, a uni-directional power supply input USI, a first bi-directional power supply input BSI1, a second bi-directional power supply input BSI2, and a linear amplifier output LAO. The switching circuitry 42 has a switching circuitry output SSO. The linear amplifier 36 receives a uni-directional power supply signal UPS via the uni-directional power supply input USI. The linear amplifier 36 receives a first bi-directional power supply signal BPS1 via the first bi-directional power supply input BSI1. The linear amplifier 36 receives a second bi-directional power supply signal BPS2 via the second bi-directional power supply input BSI2. In general, the linear amplifier 36 receives a group of linear amplifier power supply signals BPS1, BPS2, UPS via a group of power supply inputs BSI1, BSI2, USI. In one embodiment of the linear amplifier 36, the linear amplifier 36 at least partially provides the envelope power supply voltage EPV via the linear amplifier output LAO.

In one embodiment of the group of linear amplifier power supply signals BPS1, BPS2, UPS, the group of linear amplifier power supply signals BPS1, BPS2, UPS includes at least the first bi-directional power supply signal BPS1. In general, the group of linear amplifier power supply signals BPS1, BPS2, UPS includes at least one bi-directional power supply signal. In an alternate embodiment of the group of linear amplifier power supply signals BPS1, BPS2, UPS, the group of linear amplifier power supply signals BPS1, BPS2, UPS includes the first bi-directional power supply signal BPS1, the second bi-directional power supply signal BPS2, and the uni-directional power supply signal UPS. In general, the group of linear amplifier power supply signals BPS1, BPS2, UPS includes one bi-directional power supply signal, another bi-directional power supply signal, and the uni-directional power supply signal UPS. In one embodiment of the uni-directional power supply signal UPS, the first bi-directional power supply signal BPS1, and the second bi-directional power supply signal BPS2, the uni-directional power supply signal UPS has the DC source voltage DCV (FIG. 1), the first bi-directional power supply signal BPS1 has the first bi-directional power supply voltage BPV1 (FIG. 8), which is equal to about one-third of the DC source voltage DCV (FIG. 1), and the second bi-directional power supply signal BPS2 has the second bi-directional power supply voltage BPV2 (FIG. 8), which is equal to about two-thirds of the DC source voltage DCV (FIG. 1).

In another embodiment of the group of linear amplifier power supply signals BPS1, BPS2, UPS (FIG. 5), the group of linear amplifier power supply signals BPS1, BPS2, UPS includes the first bi-directional power supply signal BPS1 and the uni-directional power supply signal UPS. In general, the group of linear amplifier power supply signals BPS1, BPS2, UPS includes one bi-directional power supply signal and the uni-directional power supply signal UPS.

Figure 10:
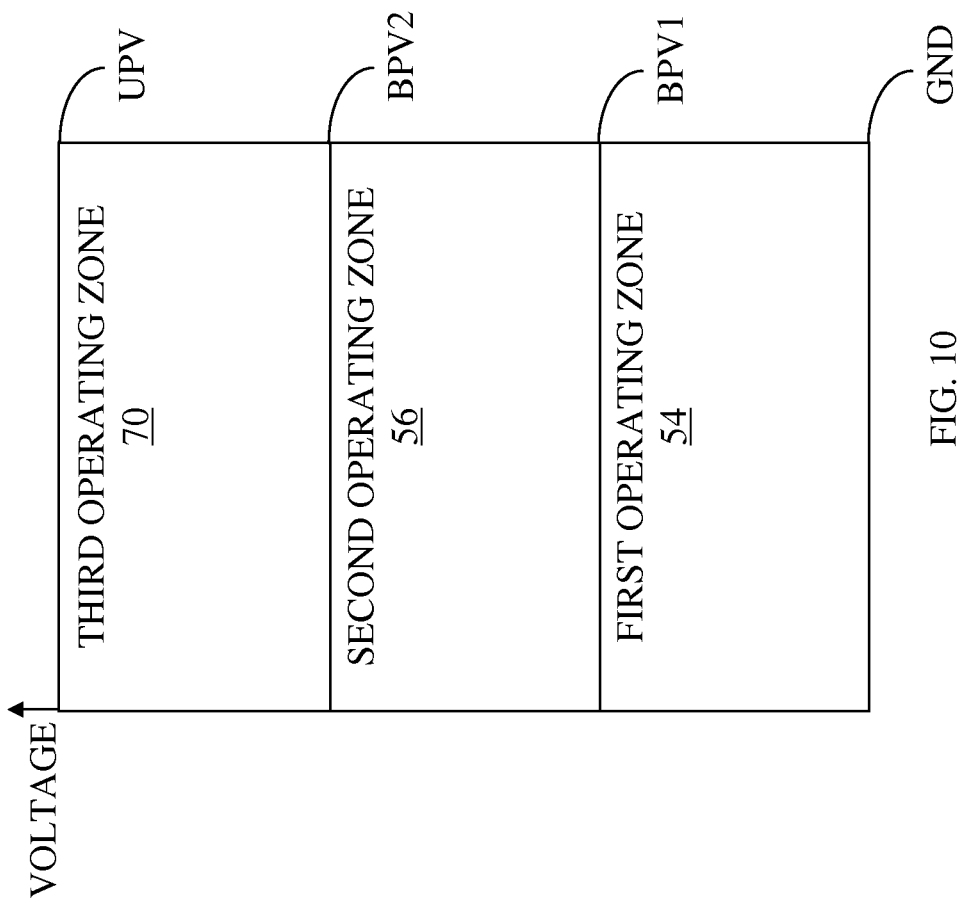
FIG. 10 is a graph illustrated operating details of the envelope tracking power supply illustrated in FIG. 4 according to one embodiment of the envelope tracking power supply.

The first bi-directional power supply signal BPS1 has a first bi-directional power supply voltage BPV1 (FIG. 10). The second bi-directional power supply signal BPS2 has a second bi-directional power supply voltage BPV2 (FIG. 10). The uni-directional power supply signal UPS has a uni-directional power supply voltage UPV. The first bi-directional power supply voltage BPV1 (FIG. 10) is higher than ground. The second bi-directional power supply voltage BPV2 is higher than the first bi-directional power supply voltage BPV1. The uni-directional power supply voltage UPV is higher than the second bi-directional power supply voltage BPV2. The linear amplifier power supply 40 provides the first bi-directional power supply signal BPS1 and the second bi-directional power supply signal BPS2 to the linear amplifier 36 using the DC source signal VDC. The DC source signal VDC provides the uni-directional power supply signal UPS.

The first inductive element L1 and the output filter capacitive element CO may form a low-pass filter to at least partially remove switching ripple produced by ripple current in the first inductive element L1. As such, the output filter capacitive element CO presents a reactive load to the envelope power supply output PSO. While the RF PA 24 (FIG. 1) may present a largely resistive load to the envelope power supply output PSO, a combination of the RF PA 24 (FIG. 1) and the output filter capacitive element CO may present a complex load to the envelope power supply output PSO.

The term bi-directional means energy may be transferred in two directions. For example, energy may be transferred into and out of each of the bi-directional power supply inputs BSI1, BSI2. Conversely, uni-directional means energy may be transferred in primarily only one direction. For example, energy is transferred primarily only to the linear amplifier 36 via the uni-directional power supply input USI. In one embodiment of the linear amplifier power supply 40, the linear amplifier power supply 40 at least partially functions as a reciprocal two-port network. As such, energy transfers into and out of the bi-directional power supply inputs BSI1, BSI2 resulting from a reactive portion of the load may at least partially cancel one another, thereby reducing a net current from the DC power source 20 (FIG. 1). Reducing the net current from the DC power source 20 (FIG. 1) increases efficiency of the envelope tracking power supply 26.

In the embodiment shown, the first inductive element L1 is directly coupled between the switching circuitry output SSO and the envelope power supply output PSO. In general, the switching circuitry output SSO is coupled to the envelope power supply output PSO via the first inductive element L1. As such, in other embodiments (not shown), the first inductive element L1 is coupled between the switching circuitry output SSO and the envelope power supply output PSO using other intervening elements (not shown).

In the embodiment shown, the offset capacitive element CA is directly coupled between the linear amplifier output LAO and the envelope power supply output PSO. In general, the linear amplifier output LAO is coupled to the envelope power supply output PSO via the offset capacitive element CA. As such, in other embodiments (not shown), the offset capacitive element CA is coupled between the linear amplifier output LAO and the envelope power supply output PSO using other intervening elements (not shown). In an alternate embodiment of the envelope tracking power supply 26, the offset capacitive element CA and the offset capacitance voltage control loop 44 are omitted, such that the linear amplifier output LAO is coupled to the envelope power supply output PSO. In an exemplary embodiment of the envelope tracking power supply 26, the offset capacitive element CA and the offset capacitance voltage control loop 44 are omitted, such that the linear amplifier output LAO is directly coupled to the envelope power supply output PSO.

In the embodiment shown, the first inductive element L1 is directly coupled between the switching circuitry output SSO and the feedback input FBI. In general, the switching circuitry output SSO is coupled to the feedback input FBI via the first inductive element L1. As such, in other embodiments (not shown), the first inductive element L1 is coupled between the switching circuitry output SSO and the feedback input FBI using other intervening elements (not shown). In one embodiment of the output filter capacitive element CO, the output filter capacitive element CO is coupled between the envelope power supply output PSO and a ground.

The linear amplifier 36 receives the envelope power supply voltage EPV via the feedback input FBI and drives the envelope power supply voltage EPV toward the setpoint of the envelope power supply voltage EPV using the feedback input FBI. In one embodiment of the linear amplifier 36, during envelope tracking, the linear amplifier 36 at least partially provides the envelope power supply voltage EPV to the RF PA 24 via the envelope power supply output PSO, such that the envelope power supply voltage EPV at least partially tracks the RF transmit signal RFT from the RF PA 24. In one embodiment of the switching supply 38, the switching supply 38 at least partially provides the envelope power supply voltage EPV via the envelope power supply output PSO.

An output voltage swing at the linear amplifier output LAO of the linear amplifier 36 is approximately between a source headroom voltage SRC (not shown) below the uni-directional power supply voltage UPV and a sink headroom voltage SNK (not shown) above the ground. However, during envelope tracking, the envelope power supply voltage EPV may traverse between an expected maximum 46 (FIG. 6) of the envelope power supply voltage EPV and an expected minimum 48 (FIG. 6) of the envelope power supply voltage EPV. Since the linear amplifier 36 drives the envelope power supply voltage EPV toward the setpoint of the envelope power supply voltage EPV, the linear amplifier 36 and the offset capacitive element CA must be able to drive between the expected maximum 46 (FIG. 6) of the envelope power supply voltage EPV and the expected minimum 48 (FIG. 6) of the envelope power supply voltage EPV. However, the expected minimum 48 (FIG. 6) of the envelope power supply voltage EPV may be significantly above ground.

In this regard, without the offset capacitive element CA, the linear amplifier 36 would need an output voltage swing between the expected maximum 46 (FIG. 6) of the envelope power supply voltage EPV and the expected minimum 48 (FIG. 6) of the envelope power supply voltage EPV. When the expected minimum 48 (FIG. 6) of the envelope power supply voltage EPV is significantly above the ground, the voltage drop between the linear amplifier output LAO and the ground is large, thereby degrading efficiency. However, by using the offset capacitive element CA, the voltage swing between the expected maximum 46 (FIG. 6) of the envelope power supply voltage EPV and the expected minimum 48 (FIG. 6) of the envelope power supply voltage EPV may be shifted down at the linear amplifier output LAO.

In this regard, to maximize efficiency, the expected minimum 48 (FIG. 6) of the envelope power supply voltage EPV at the envelope power supply output PSO would be shifted down to about the sink headroom voltage SNK (not shown) above ground at the linear amplifier output LAO, and the expected maximum 46 (FIG. 6) of the envelope power supply voltage EPV at the envelope power supply output PSO would be shifted down to about the source headroom voltage SRC (not shown) below the uni-directional power supply voltage UPV.

In one embodiment of the offset capacitance voltage control loop 44, the offset capacitive element CA has an offset capacitive voltage OSV, which is regulated by the offset capacitance voltage control loop 44. In one embodiment of the offset capacitance voltage control loop 44, the offset capacitive voltage OSV is regulated to be about constant. Further, in one embodiment of the offset capacitance voltage control loop 44, the offset capacitive voltage OSV is further regulated, such that an average DC current through the offset capacitive element CA is equal to about zero.

If the offset capacitive voltage OSV is too large, then the linear amplifier 36 will be unable to drive the linear amplifier output LAO low enough to provide the expected minimum 48 (FIG. 6) of the envelope power supply voltage EPV at the linear amplifier output LAO. Therefore, in one embodiment of the offset capacitance voltage control loop 44, the offset capacitance voltage control loop 44 regulates the offset capacitive voltage OSV, such that the offset capacitive voltage OSV is less than or equal to a difference between the expected minimum 48 (FIG. 6) of the envelope power supply voltage EPV and the sink headroom voltage SNK (not shown). In one embodiment of the sink headroom voltage SNK (not shown), the sink headroom voltage SNK (not shown) is equal to about 0.2 volts. If the expected minimum 48 (FIG. 6) of the envelope power supply voltage EPV is represented as EMN, the above requirement is shown in EQ. 1, below.

$$OSV <= EMN - SNK. \qquad \text{EQ. 1:}$$

Additionally, a sum of the uni-directional power supply voltage UPV and the offset capacitive voltage OSV must be high enough to provide the expected maximum 46 (FIG. 6) of the envelope power supply voltage EPV. In one embodiment of the envelope tracking power supply 26, the uni-directional power supply voltage UPV is greater than or equal to a sum of the source headroom voltage SRC (not shown) and a difference between the expected maximum 46 (FIG. 6) of the envelope power supply voltage EPV and the offset capacitive voltage OSV. In one embodiment of the source headroom voltage SRC (not shown), the source headroom voltage SRC (not shown) is equal to about 0.1 volts. If the expected maximum 46 (FIG. 6) of the envelope power supply voltage EPV is represented as EMX, the above requirement is shown in EQ. 2, below.

$$UPV >= SRC + EMX - OSV.\qquad\text{EQ. 2:}$$

In this regard, in one embodiment of the envelope tracking power supply 26, the offset capacitive voltage OSV is regulated to minimize a voltage drop between the linear amplifier output LAO and the ground when the linear amplifier 36 is sinking current. Further, in one embodiment of the envelope tracking power supply 26, the offset capacitive voltage OSV is regulated to minimize a voltage drop between the linear amplifier output LAO and the DC power source 20 (FIG. 1) when the linear amplifier 36 is sourcing current. Minimizing these voltage drops improves the efficiency of the envelope tracking power supply 26

The power supply control circuitry 34 is coupled to each of the linear amplifier 36, the linear amplifier power supply 40, the switching circuitry 42, and the offset capacitance voltage control loop 44. As such, in one embodiment of the power supply control circuitry 34, the power supply control circuitry 34 provides information and receives information from any or all of the linear amplifier 36, the linear amplifier power supply 40, the switching circuitry 42, and the offset capacitance voltage control loop 44, as needed. The switching supply 38 and the linear amplifier power supply 40 receive the DC source signal VDC from the DC power source 20 (FIG. 1).

Figure 5:
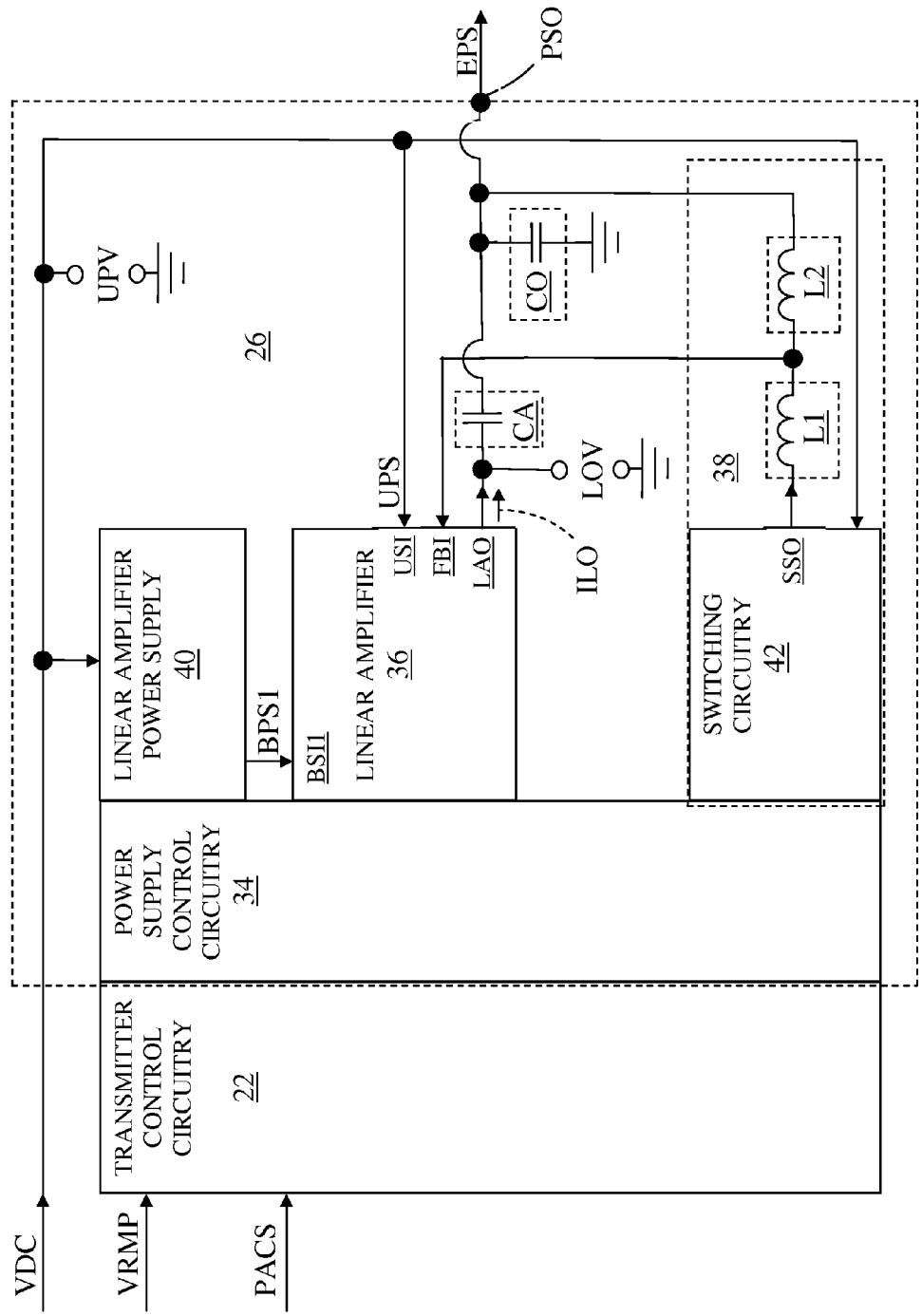
FIG. 5 shows details of the envelope tracking power supply illustrated in FIG. 1 according to an additional embodiment of the envelope tracking power supply.

FIG. 5 shows details of the envelope tracking power supply 26 illustrated in FIG. 1 according to an additional embodiment of the envelope tracking power supply 26. The envelope tracking power supply 26 illustrated in FIG. 5 is similar to the envelope tracking power supply 26 illustrated in FIG. 4, except in the envelope tracking power supply 26 illustrated in FIG. 5, the switching supply 38 further includes a second inductive element L2, the second bi-directional power supply input BSI2 and the second bi-directional power supply signal BPS2 are omitted, and the offset capacitance voltage control loop 44 is not shown for clarity. The linear amplifier 36 provides a linear amplifier output voltage LOV and a linear amplifier output current ILO via the linear amplifier output LAO.

In one embodiment of the switching supply 38, the switching supply 38 operates to drive the linear amplifier output current ILO toward zero to maximize efficiency. In one embodiment of the group of linear amplifier power supply signals BPS1, BPS2, UPS, the group of linear amplifier power supply signals BPS1, BPS2, UPS includes the uni-directional power supply signal UPS and the first bi-directional power supply signal BPS1. In general, the group of linear amplifier power supply signals BPS1, BPS2, UPS includes the uni-directional power supply signal UPS and one bi-directional power supply signal. In one embodiment of the group of linear amplifier power supply signals BPS1, BPS2, UPS, the group of linear amplifier power supply signals BPS1, BPS2, UPS is limited to the uni-directional power supply signal UPS and one bi-directional power supply signal. In one embodiment of the uni-directional power supply signal UPS and the first bi-directional power supply signal BPS1, the uni-directional power supply signal UPS has the DC source voltage DCV (FIG. 1) and the first bi-directional power supply signal BPS1 has the first bi-directional power supply voltage BPV1 (FIG. 8), which is equal to about one-half of the DC source voltage DCV (FIG. 1). In one embodiment of the DC power source 20 (FIG. 1), the DC power source 20 (FIG. 1) is a battery, which provides the uni-directional power supply signal UPS.

Further, in the envelope tracking power supply 26 illustrated in FIG. 4, the first inductive element L1 is directly coupled between the switching circuitry output SSO and the envelope power supply output PSO. However, in the envelope tracking power supply 26 illustrated in FIG. 5, the first inductive element L1 and the second inductive element L2 are coupled in series between the switching circuitry output SSO and the envelope power supply output PSO. As such, the first inductive element L1 is directly coupled between the switching circuitry output SSO and the feedback input FBI, and the second inductive element L2 is directly coupled between the feedback input FBI and the envelope power supply output PSO.

In one embodiment of the envelope tracking power supply 26, the series combination of the first inductive element L1 and the second inductive element L2 form a voltage divider, which provides a phase-shifted signal to the feedback input FBI. The voltage divider may compensate for bandwidth limitations in the linear amplifier 36, thereby providing improved regulation of the envelope power supply voltage EPV. The first inductive element L1 has a first inductance and the second inductive element L2 has a second inductance.

In a first embodiment of the first inductive element L1 and the second inductive element L2, a ratio of the first inductance divided by the second inductance is greater than ten. In a second embodiment of the first inductive element L1 and the second inductive element L2, a ratio of the first inductance divided by the second inductance is greater than 100. In a third embodiment of the first inductive element L1 and the second inductive element L2, a ratio of the first inductance divided by the second inductance is greater than 500. In a fourth embodiment of the first inductive element L1 and the second inductive element L2, a ratio of the first inductance divided by the second inductance is greater than 1000. In a fifth embodiment of the first inductive element L1 and the second inductive element L2, a ratio of the first inductance divided by the second inductance is less than 5000.

FIG. 6 is a graph illustrating the RF transmit signal RFT and the envelope power supply voltage EPV shown in FIGS. 1 and 4, respectively, according to one embodiment of the RF transmit signal RFT and the envelope power supply voltage EPV. During envelope tracking, the envelope tracking power supply 26 (FIG. 1) provides the envelope power supply voltage EPV to the RF PA 24 (FIG. 1) via the envelope power supply output PSO (FIG. 4), such that the envelope power supply voltage EPV at least partially tracks the RF transmit signal RFT from the RF PA 24 (FIG. 1), as shown in FIG. 6. In this regard, the RF transmit signal RFT is amplitude modulated and the envelope power supply voltage EPV at least partially follows an envelope of the RF transmit signal RFT, as shown. The envelope power supply voltage EPV has the expected maximum 46 and the expected minimum 48, as shown in FIG. 6.

Figure 8:
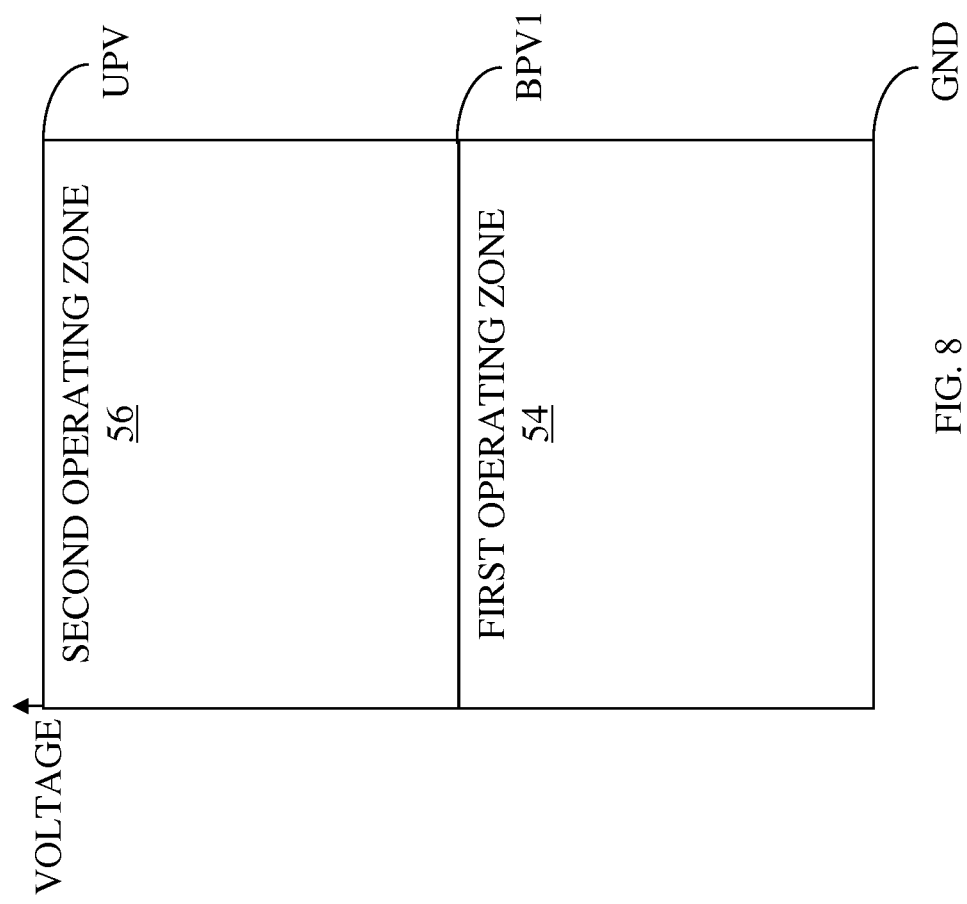
FIG. 8 is a graph illustrated operating details of the envelope tracking power supply illustrated in FIG. 5 according to one embodiment of the envelope tracking power supply.

In one embodiment of the envelope tracking power supply 26 (FIG. 1), the envelope power supply voltage EPV traverses between the expected maximum 46 and the expected minimum 48, such that the linear amplifier 36 toggles between operating in a first operating zone 54 (FIG. 8) and operating in a second operating zone 56 (FIG. 8). In an alternate embodiment of the envelope tracking power supply 26 (FIG. 1), the envelope power supply voltage EPV traverses between the expected maximum 46 and the expected minimum 48, such that the linear amplifier 36 cycles through operating in the first operating zone 54 (FIG. 10), operating in the second operating zone 56 (FIG. 10), and operating in a third operating zone 70 (FIG. 10).

In one embodiment of the envelope power supply voltage EPV and the RF transmit signal RFT, the expected maximum 46 of the envelope power supply voltage EPV is high enough to accommodate the envelope of the RF transmit signal RFT without causing significant distortion of the RF transmit signal RFT. In an alternate embodiment of the envelope power supply voltage EPV and the RF transmit signal RFT, the expected maximum 46 of the envelope power supply voltage EPV is low enough to cause clipping (not shown) of the envelope of the RF transmit signal RFT, thereby causing some distortion of the RF transmit signal RFT. However, if the distortion of the RF transmit signal RFT is small enough to allow compliance with communications standards, the clipping may be acceptable.

FIG. 7A shows details of the linear amplifier power supply 40 illustrated in FIG. 5 according to one embodiment of the linear amplifier power supply 40. The linear amplifier power supply 40 includes a charge pump 50 and a first supply capacitive element C1. The charge pump 50 receives the DC source signal VDC and provides the first bi-directional power supply signal BPS1 based on the DC source signal VDC. The first supply capacitive element C1 is coupled between the charge pump 50 and ground, as shown. In one embodiment of the charge pump 50, the charge pump 50 at least partially functions as a reciprocal two-port network.

FIGS. 7B, 7C, and 7D show details of the linear amplifier power supply 40 illustrated in FIG. 5 according to three different embodiment of the linear amplifier power supply 40, respectively. The linear amplifier power supply 40 illustrated in FIG. 7B includes the charge pump 50, the first supply capacitive element C1, and a second supply capacitive element C2. The charge pump 50 receives the DC source signal VDC and provides the first bi-directional power supply signal BPS1 and the second bi-directional power supply signal BPS2 based on the DC source signal VDC. The first supply capacitive element C1 and the second supply capacitive element C2 are coupled between the charge pump 50 and ground, as shown. In one embodiment of the charge pump 50, the charge pump 50 at least partially functions as a reciprocal two-port network.

The linear amplifier power supply 40 illustrated in FIG. 7C includes the first supply capacitive element C1 and the second supply capacitive element C2. The first supply capacitive element C1 provides the first bi-directional power supply signal BPS1 and the second supply capacitive element C2 provides the second bi-directional power supply signal BPS2, as shown. The first supply capacitive element C1 functions as a reciprocal two-port network and the second supply capacitive element C2 functions as a reciprocal two-port network. In an alternate embodiment of the linear amplifier power supply 40 illustrated in FIG. 7C, the second supply capacitive element C2 and the second bi-directional power supply signal BPS2 are omitted.

The linear amplifier power supply 40 illustrated in FIG. 7D includes a two flying capacitor-based charge pump 52, a first flying capacitive element CF1, a second flying capacitive element CF2, the first supply capacitive element C1, and the second supply capacitive element C2. The first flying capacitive element CF1 and the second flying capacitive element CF2 are coupled to the two flying capacitor-based charge pump 52, which charges and discharges each of the first flying capacitive element CF1 and the second flying capacitive element CF2 as needed to provide the first bi-directional power supply signal BPS1 and the second bi-directional power supply signal BPS2. The two flying capacitor-based charge pump 52 receives the DC source signal VDC and provides the first bi-directional power supply signal BPS1 and the second bi-directional power supply signal BPS2 based on the DC source signal VDC. The first supply capacitive element C1 and the second supply capacitive element C2 are coupled between the two flying capacitor-based charge pump 52 and ground, as shown. In one embodiment of the charge pump 50, the two flying capacitor-based charge pump 52 at least partially functions as a reciprocal two-port network. In an alternate embodiment of the linear amplifier power supply 40 illustrated in FIG. 7D, the second supply capacitive element C2 and the second bi-directional power supply signal BPS2 are omitted.

FIG. 8 is a graph illustrated operating details of the envelope tracking power supply 26 illustrated in FIG. 5 according to one embodiment of the envelope tracking power supply 26. The linear amplifier 36 (FIG. 4) operates in either the first operating zone 54 or the second operating zone 56. The linear amplifier 36 (FIG. 4) operates in the first operating zone 54 when the linear amplifier output voltage LOV (FIG. 5) is between ground and the first bi-directional power supply voltage BPV1. The linear amplifier 36 (FIG. 4) operates in the second operating zone 56 when the linear amplifier output voltage LOV (FIG. 5) is between the first bi-directional power supply voltage BPV1 and the uni-directional power supply voltage UPV.

When the setpoint of the envelope power supply voltage is above the envelope power supply voltage EPV (FIG. 4), the linear amplifier output current ILO (FIG. 5) needs to be a sourcing current to bring the envelope power supply voltage EPV (FIG. 4) into regulation. Therefore, when the linear amplifier 36 (FIG. 4) operates in the first operating zone 54, if there is sufficient source headroom voltage SRC (not shown), then the linear amplifier 36 (FIG. 4) uses the first bi-directional power supply signal BPS1 (FIG. 4) to provide the sourcing current. If there is insufficient source headroom voltage SRC (not shown), then the linear amplifier 36 (FIG. 4) uses the uni-directional power supply signal UPS (FIG. 4) to provide the sourcing current. Alternatively, when the linear amplifier 36 (FIG. 4) operates in the second operating zone 56, the linear amplifier 36 (FIG. 4) uses the uni-directional power supply signal UPS (FIG. 4) to provide the sourcing current.

When the setpoint of the envelope power supply voltage is below the envelope power supply voltage EPV (FIG. 4), the linear amplifier output current ILO (FIG. 5) needs to be a sinking current to bring the envelope power supply voltage EPV (FIG. 4) into regulation. Therefore, when the linear amplifier 36 (FIG. 4) operates in the first operating zone 54, the linear amplifier 36 (FIG. 4) uses ground to provide the sinking current. Alternatively, when the linear amplifier 36 (FIG. 4) operates in the second operating zone 56, if there is sufficient sink headroom voltage SNK (not shown), then the linear amplifier 36 (FIG. 4) uses the first bi-directional power supply signal BPS1 (FIG. 4) to provide the sinking current. If there is insufficient sink headroom voltage SNK (not shown), then the linear amplifier 36 (FIG. 4) uses ground to provide the sinking current.

Figure 9:
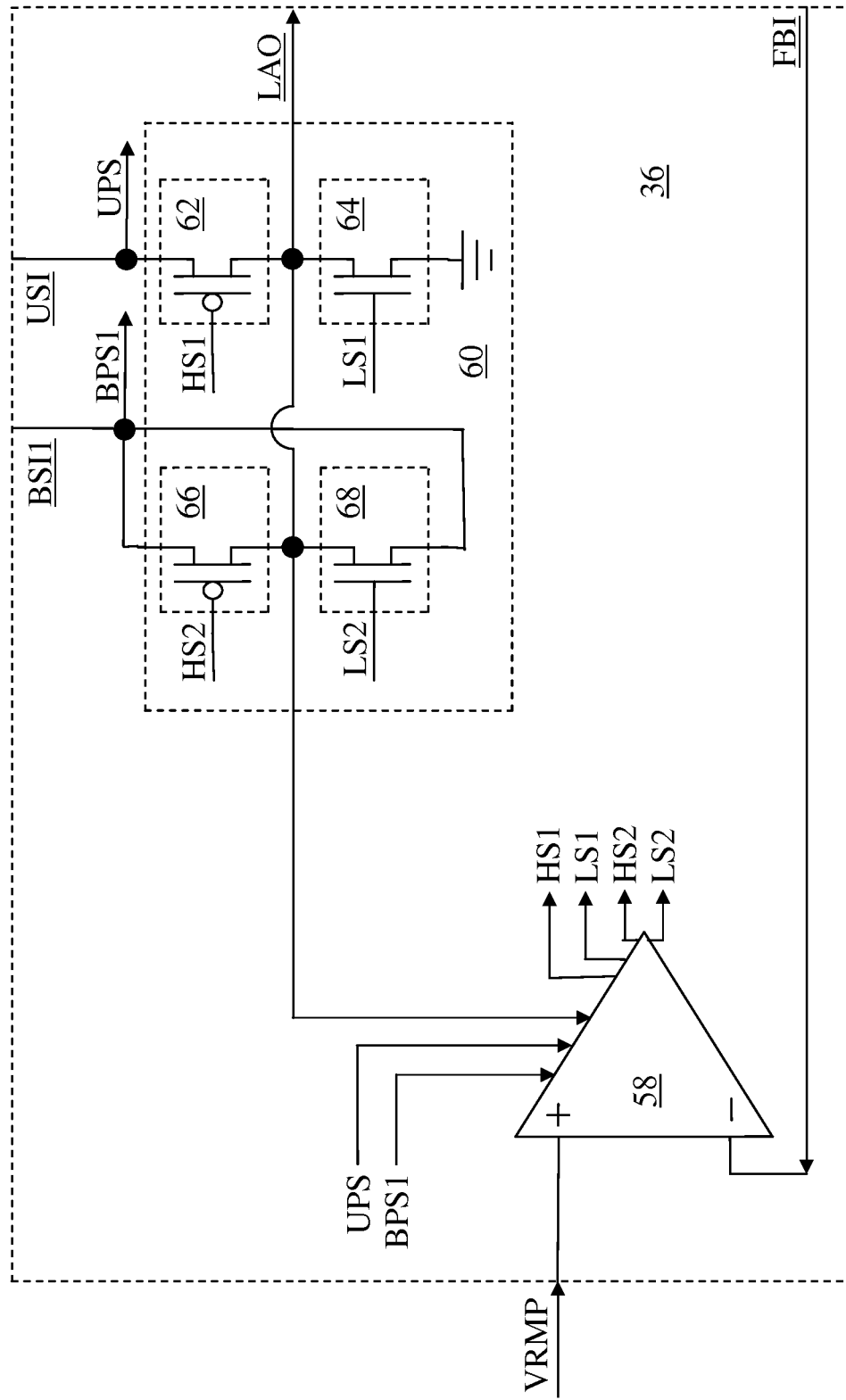
FIG. 9 shows details of the linear amplifier illustrated in FIG. 5 according to one embodiment of the linear amplifier.

FIG. 9 shows details of the linear amplifier 36 illustrated in FIG. 5 according to one embodiment of the linear amplifier 36. The linear amplifier 36 includes an input amplifier stage 58 and an output amplifier stage 60. The linear amplifier 36 has the feedback input FBI, the linear amplifier output LAO, the uni-directional power supply input USI, and the first bi-directional power supply input BSI1. The output amplifier stage 60 includes a first sourcing transistor element 62, a first sinking transistor element 64, a second sourcing transistor element 66, and a second sinking transistor element 68.

The first sinking transistor element 64 is coupled between the linear amplifier output LAO and ground. The first sourcing transistor element 62 is coupled between the linear amplifier output LAO and the uni-directional power supply input USI. The second sinking transistor element 68 is coupled between the linear amplifier output LAO and the first bi-directional power supply input BSI1. The second sourcing transistor element 66 is coupled between the linear amplifier output LAO and the first bi-directional power supply input BSI1. The first sourcing transistor element 62 may substantially source the linear amplifier output current ILO (FIG. 5) based on a first sourcing control signal HS1. The first sinking transistor element 64 may substantially sink the linear amplifier output current ILO (FIG. 5) based on a first sinking control signal LS1. The second sourcing transistor element 66 may substantially source the linear amplifier output current ILO (FIG. 5) based on a second sourcing control signal HS2. The second sinking transistor element 68 may substantially sink the linear amplifier output current ILO (FIG. 5) based on a second sinking control signal LS2.

The input amplifier stage 58 has an inverting input and a non-inverting input. The inverting input receives the envelope power supply voltage EPV (FIG. 4) via the feedback input FBI. The non-inverting input receives the envelope power supply control signal VRMP, which is representative of the setpoint of the envelope power supply voltage. The input amplifier stage 58 determines if the linear amplifier 36 should be sinking current or sourcing current based on a difference between the envelope power supply voltage EPV (FIG. 4) and the setpoint of the envelope power supply voltage.

Additionally, the input amplifier stage 58 receives the linear amplifier output voltage LOV (FIG. 5) via the linear amplifier output LAO. The input amplifier stage 58 further receives the uni-directional power supply signal UPS via the uni-directional power supply input USI and receives the first bi-directional power supply signal BPS1 via the first bi-directional power supply input BSI1. The input amplifier stage 58 determines which one of the first operating zone 54 (FIG. 8) and the second operating zone 56 (FIG. 8) is selected based on the linear amplifier output voltage LOV (FIG. 5), the uni-directional power supply signal UPS, and the first bi-directional power supply signal BPS1.

The input amplifier stage 58 provides a group of control signals HS1, LS1, HS2, LS2 to the output amplifier stage 60, such that each of the first sourcing transistor element 62, the first sinking transistor element 64, the second sourcing transistor element 66, and the second sinking transistor element 68 receives a corresponding one of the group of control signals HS1, LS1, HS2, LS2. The group of control signals HS1, LS1, HS2, LS2 are based on the linear amplifier output voltage LOV (FIG. 5), the envelope power supply control signal VRMP, and the one of the first operating zone 54 (FIG. 8) and the second operating zone 56 (FIG. 8) that is selected.

In this regard, the output amplifier stage 60 at least partially provides the envelope power supply voltage EPV (FIG. 4) to the RF PA 24 (FIG. 1) via the envelope power supply output PSO (FIG. 4) using a selected one of a group of linear amplifier power supply signals BPS1, UPS. The input amplifier stage 58 selects the selected one of a group of linear amplifier power supply signals BPS1, UPS based on the envelope power supply voltage EPV (FIG. 4) and the setpoint of the envelope power supply voltage.

FIG. 10 is a graph illustrated operating details of the envelope tracking power supply 26 illustrated in FIG. 4 according to one embodiment of the envelope tracking power supply 26.

The linear amplifier 36 (FIG. 4) operates in one of the first operating zone 54, the second operating zone 56, and the third operating zone 70. The linear amplifier 36 (FIG. 4) operates in the first operating zone 54 when the linear amplifier output voltage LOV (FIG. 5) is between ground and the first bi-directional power supply voltage BPV1. The linear amplifier 36 (FIG. 4) operates in the second operating zone 56 when the linear amplifier output voltage LOV (FIG. 5) is between the first bi-directional power supply voltage BPV1 and the second bi-directional power supply voltage BPV2. The linear amplifier 36 (FIG. 4) operates in the third operating zone 70 when the linear amplifier output voltage LOV (FIG. 5) is between the second bi-directional power supply voltage BPV2 and the uni-directional power supply voltage UPV.

When the setpoint of the envelope power supply voltage is above the envelope power supply voltage EPV (FIG. 4), the linear amplifier output current ILO (FIG. 5) needs to be a sourcing current to bring the envelope power supply voltage EPV (FIG. 4) into regulation. Therefore, when the linear amplifier 36 (FIG. 4) operates in the first operating zone 54, if there is sufficient source headroom voltage SRC (not shown), then the linear amplifier 36 (FIG. 4) uses the first bi-directional power supply signal BPS1 (FIG. 4) to provide the sourcing current. If there is insufficient source headroom voltage SRC (not shown), then the linear amplifier 36 (FIG. 4) uses the second bi-directional power supply signal BPS2 (FIG. 4) to provide the sourcing current.

Alternatively, when the linear amplifier 36 (FIG. 4) operates in the second operating zone 56, if there is sufficient source headroom voltage SRC (not shown), then the linear amplifier 36 (FIG. 4) uses the second bi-directional power supply signal BPS2 (FIG. 4) to provide the sourcing current. If there is insufficient source headroom voltage SRC (not shown), then the linear amplifier 36 (FIG. 4) uses the uni-directional power supply signal UPS (FIG. 4) to provide the sourcing current. Further, when the linear amplifier 36 (FIG. 4) operates in the third operating zone 70, the linear amplifier 36 (FIG. 4) uses the uni-directional power supply signal UPS (FIG. 4) to provide the sourcing current.

When the setpoint of the envelope power supply voltage is below the envelope power supply voltage EPV (FIG. 4), the linear amplifier output current ILO (FIG. 5) needs to be a sinking current to bring the envelope power supply voltage EPV (FIG. 4) into regulation. Therefore, when the linear amplifier 36 (FIG. 4) operates in the first operating zone 54, the linear amplifier 36 (FIG. 4) uses ground to provide the sinking current. Alternatively, when the linear amplifier 36 (FIG. 4) operates in the second operating zone 56, if there is sufficient sink headroom voltage SNK (not shown), then the linear amplifier 36 (FIG. 4) uses the first bi-directional power supply signal BPS1 (FIG. 4) to provide the sinking current. If there is insufficient sink headroom voltage SNK (not shown), then the linear amplifier 36 (FIG. 4) uses ground to provide the sinking current. Further, when the linear amplifier 36 (FIG. 4) operates in the third operating zone 70, if there is sufficient sink headroom voltage SNK (not shown), then the linear amplifier 36 (FIG. 4) uses the second bi-directional power supply signal BPS2 (FIG. 4) to provide the sinking current. If there is insufficient sink headroom voltage SNK (not shown), then the linear amplifier 36 (FIG. 4) uses the first bi-directional power supply signal BPS1 (FIG. 4) to provide the sinking current.

Figure 11:
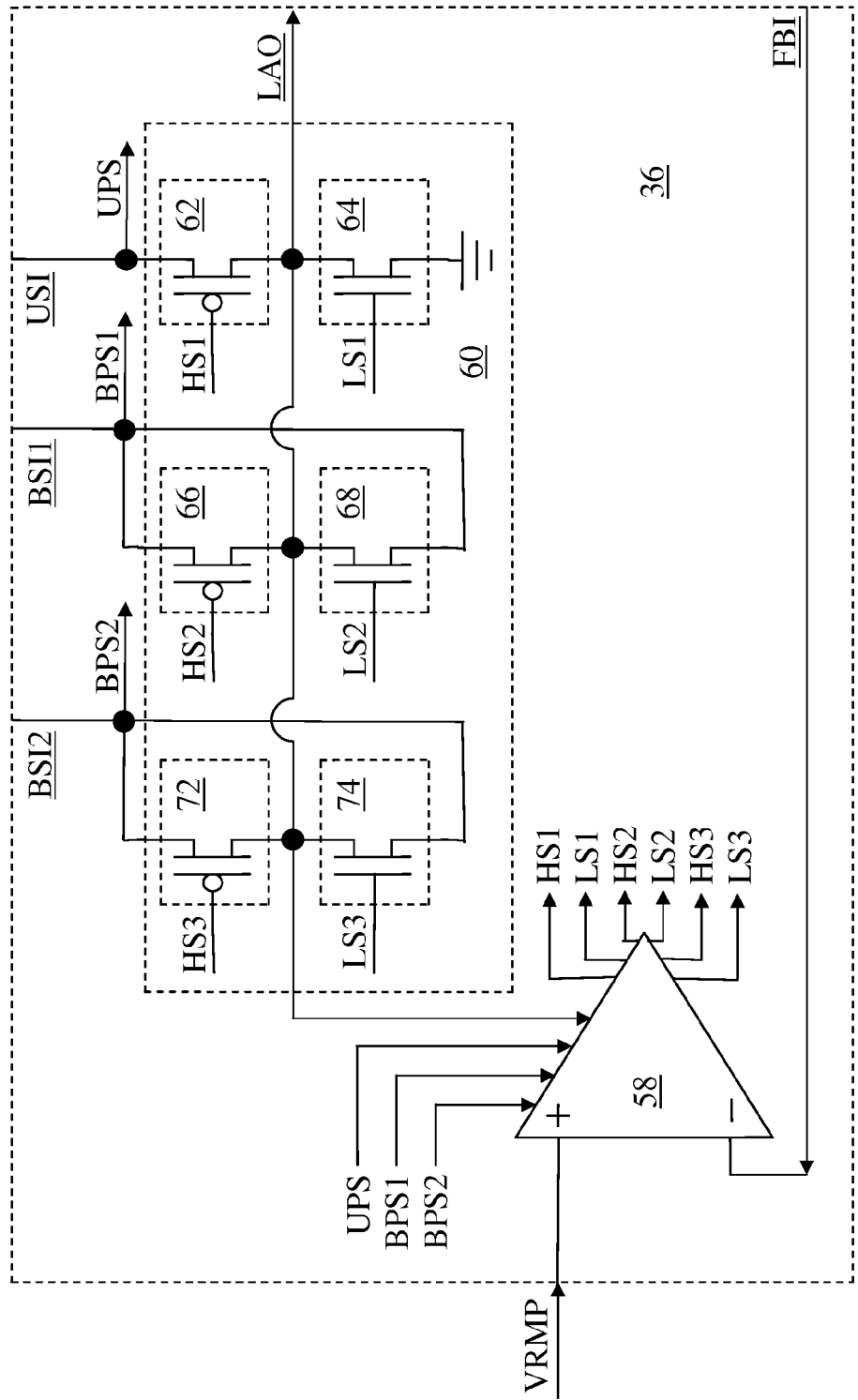
FIG. 11 shows details of the linear amplifier illustrated in FIG. 4 according to one embodiment of the linear amplifier.

FIG. 11 shows details of the linear amplifier 36 illustrated in FIG. 4 according to one embodiment of the linear amplifier 36. The linear amplifier 36 includes the input amplifier stage 58 and the output amplifier stage 60. The linear amplifier 36 has the feedback input FBI, the linear amplifier output LAO, the uni-directional power supply input USI, the first bi-directional power supply input BSI1, and the second bi-directional power supply input BSI2. The output amplifier stage 60 includes the first sourcing transistor element 62, the first sinking transistor element 64, the second sourcing transistor element 66, the second sinking transistor element 68, a third sourcing transistor element 72, and a third sinking transistor element 74.

The first sinking transistor element 64 is coupled between the linear amplifier output LAO and ground. The first sourcing transistor element 62 is coupled between the linear amplifier output LAO and the uni-directional power supply input USI. The second sinking transistor element 68 is coupled between the linear amplifier output LAO and the first bi-directional power supply input BSI1. The second sourcing transistor element 66 is coupled between the linear amplifier output LAO and the first bi-directional power supply input BSI1. The third sinking transistor element 74 is coupled between the linear amplifier output LAO and the second bi-directional power supply input BSI2. The third sourcing transistor element 72 is coupled between the linear amplifier output LAO and the second bi-directional power supply input BSI2.

The first sourcing transistor element 62 may substantially source the linear amplifier output current ILO (FIG. 5) based on the first sourcing control signal HS1. The first sinking transistor element 64 may substantially sink the linear amplifier output current ILO (FIG. 5) based on the first sinking control signal LS1. The second sourcing transistor element 66 may substantially source the linear amplifier output current ILO (FIG. 5) based on the second sourcing control signal HS2. The second sinking transistor element 68 may substantially sink the linear amplifier output current ILO (FIG. 5) based on the second sinking control signal LS2. The third sourcing transistor element 72 may substantially source the linear amplifier output current ILO (FIG. 5) based on a third sourcing control signal HS3. The third sinking transistor element 74 may substantially sink the linear amplifier output current ILO (FIG. 5) based on a third sinking control signal LS3.

The input amplifier stage 58 has the inverting input and the non-inverting input. The inverting input receives the envelope power supply voltage EPV (FIG. 4) via the feedback input FBI. The non-inverting input receives the envelope power supply control signal VRMP, which is representative of the setpoint of the envelope power supply voltage. The input amplifier stage 58 determines if the linear amplifier 36 should be sinking current or sourcing current based on a difference between the envelope power supply voltage EPV (FIG. 4) and the setpoint of the envelope power supply voltage.

Additionally, the input amplifier stage 58 receives the linear amplifier output voltage LOV (FIG. 5) via the linear amplifier output LAO. The input amplifier stage 58 further receives the uni-directional power supply signal UPS via the uni-directional power supply input USI, receives the first bi-directional power supply signal BPS1 via the first bi-directional power supply input BSI1, and receives the second bi-directional power supply signal BPS2 via the second bi-directional power supply input BSI2. The input amplifier stage 58 determines which one of the first operating zone 54 (FIG. 8), the second operating zone 56 (FIG. 8), and the third operating zone 70 (FIG. 8) is selected based on the linear amplifier output voltage LOV (FIG. 5), the uni-directional power supply signal UPS, the first bi-directional power supply signal BPS1, and the second bi-directional power supply signal BPS2.

The input amplifier stage 58 provides a group of control signals HS1, LS1, HS2, LS2, HS3, LS3 to the output amplifier stage 60, such that each of the first sourcing transistor element 62, the first sinking transistor element 64, the second sourcing transistor element 66, the second sinking transistor element 68, the third sourcing transistor element 72, and the third sinking transistor element 74 receives a corresponding one of the group of control signals HS1, LS1, HS2, LS2, HS3, LS3. The group of control signals HS1, LS1, HS2, LS2, HS3, LS3 are based on the linear amplifier output voltage LOV (FIG. 5), the envelope power supply control signal VRMP, and the one of the first operating zone 54 (FIG. 8), the second operating zone 56 (FIG. 8), and the third operating zone 70 (FIG. 8) that is selected.

In this regard, the output amplifier stage 60 at least partially provides the envelope power supply voltage EPV (FIG. 4) to the RF PA 24 (FIG. 1) via the envelope power supply output PSO (FIG. 4) using a selected one of a group of linear amplifier power supply signals BPS1, BPS2, UPS. The input amplifier stage 58 selects the selected one of a group of linear amplifier power supply signals BPS1, BPS2, UPS based on the envelope power supply voltage EPV (FIG. 4) and the setpoint of the envelope power supply voltage.

Figure 12:
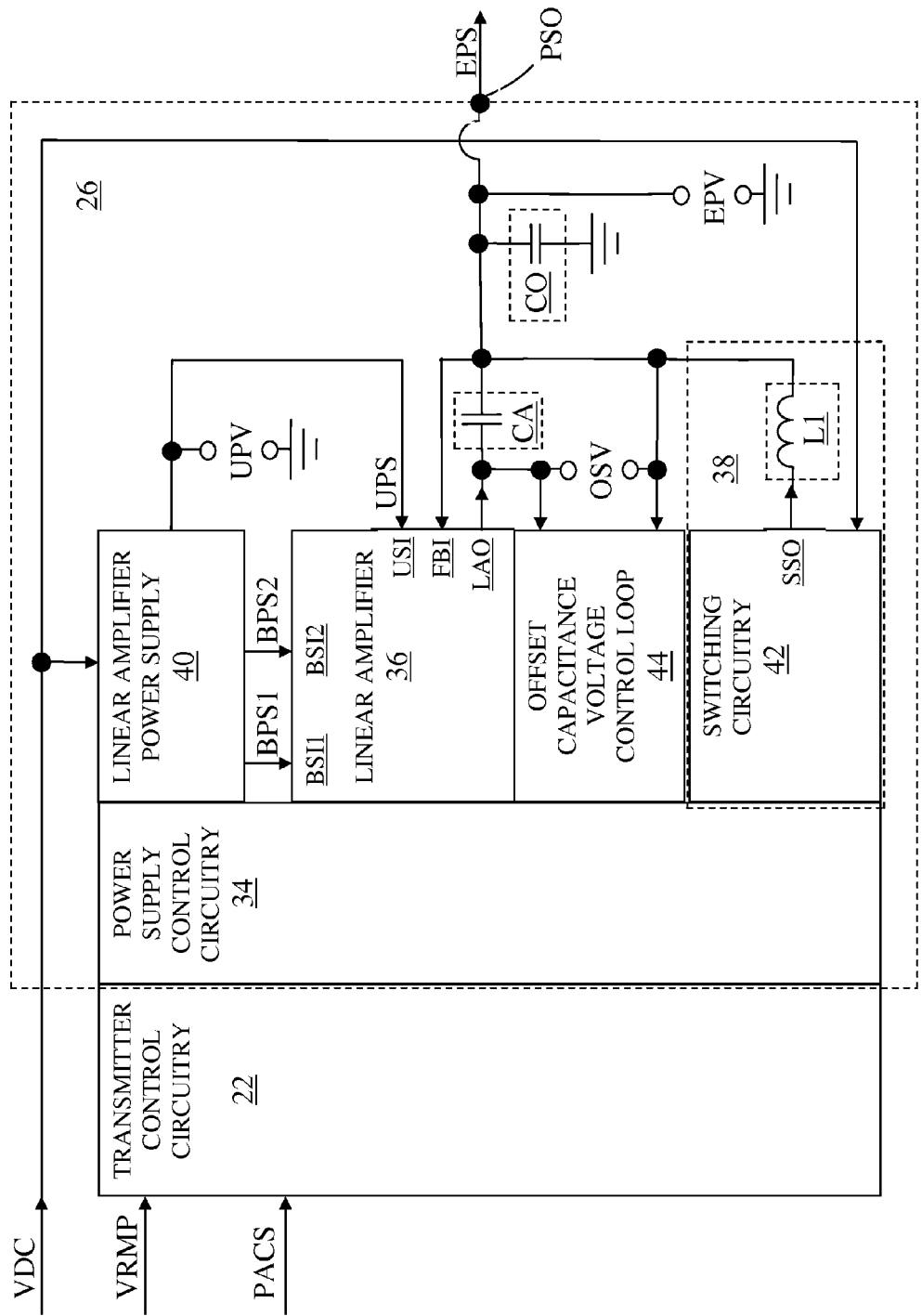
FIG. 12 shows details of the envelope tracking power supply illustrated in FIG. 4 according to one embodiment of the envelope tracking power supply.

FIG. 12 shows details of the envelope tracking power supply 26 illustrated in FIG. 4 according to one embodiment of the envelope tracking power supply 26. The envelope tracking power supply 26 illustrated in FIG. 12 is similar to the envelope tracking power supply 26 illustrated in FIG. 4, except in the envelope tracking power supply 26 illustrated in FIG. 12, the linear amplifier power supply 40 provides the uni-directional power supply signal UPS instead of the DC source signal VDC providing the uni-directional power supply signal UPS.

Those skilled in the art will recognize improvements and modifications to the embodiments of the present disclosure. All such improvements and modifications are considered within the scope of the concepts disclosed herein and the claims that follow.

What is claimed is:
1. Circuitry comprising:
   an output amplifier stage configured to at least partially provide an envelope power supply voltage to a radio frequency (RF) power amplifier (PA) via an envelope power supply output using a selected one of a plurality of linear amplifier power supply signals, such that the plurality of linear amplifier power supply signals includes at least a first bi-directional power supply signal; and
   an input amplifier stage configured to select the one of the plurality of linear amplifier power supply signals based on the envelope power supply voltage and a setpoint of the envelope power supply voltage, such that the input amplifier stage and the output amplifier stage form a linear amplifier, which has a linear amplifier output.

2. The circuitry of claim 1 further comprising a switching supply configured to partially provide the envelope power supply voltage via the envelope power supply output.

3. The circuitry of claim 2 wherein the switching supply is further configured to drive an output current from the linear amplifier toward zero.

4. The circuitry of claim 1 wherein the linear amplifier is configured to regulate the envelope power supply voltage based on the setpoint of the envelope power supply voltage.

5. The circuitry of claim 1 further comprising a filter capacitive element coupled between the envelope power supply output and a ground.

6. The circuitry of claim 1 further comprising an offset capacitive element coupled between the envelope power supply output and the linear amplifier output.

7. The circuitry of claim 1 wherein an envelope power supply control signal is representative of the setpoint of the envelope power supply voltage.

8. The circuitry of claim 7 wherein the envelope power supply control signal is amplitude modulated to provide at least partial envelope tracking of an RF transmit signal.

9. The circuitry of claim 7 wherein a bandwidth of the envelope power supply control signal is greater than about 20 megahertz.

10. The circuitry of claim 7 wherein a bandwidth of the envelope power supply control signal is greater than about 40 megahertz.

11. The circuitry of claim 1 wherein the RF PA is configured to receive and amplify an RF input signal to provide an RF transmit signal using the envelope power supply voltage, which is used for amplification.

12. The circuitry of claim 1 further comprising a linear amplifier power supply, wherein:
the linear amplifier further has a first bi-directional power supply input, a second bi-directional power supply input, and a uni-directional power supply input;
the plurality of linear amplifier power supply signals includes the first bi-directional power supply signal, a second bi-directional power supply signal, and a uni-directional power supply signal;
the linear amplifier power supply is configured to provide the first bi-directional power supply signal and the second bi-directional power supply signal; and
the linear amplifier is configured to:
receive the first bi-directional power supply signal via the first bi-directional power supply input;
receive the second bi-directional power supply signal via the second bi-directional power supply input;
receive the uni-directional power supply signal via the uni-directional power supply input;
provide a linear amplifier output current via the linear amplifier output; and
at least partially provide the envelope power supply voltage via the linear amplifier output.

13. The circuitry of claim 12 wherein the linear amplifier power supply comprises a charge pump, which is configured to provide the first bi-directional power supply signal and the second bi-directional power supply signal.

14. The circuitry of claim 12 wherein the uni-directional power supply signal has a DC source voltage; the first bi-directional power supply signal has a voltage, which is equal to about one-third of the DC source voltage; and the second bi-directional power supply signal has a voltage, which is equal to about two-thirds of the DC source voltage.

15. The circuitry of claim 1 wherein a supply capacitive element is configured to provide the first bi-directional power supply signal.

16. The circuitry of claim 1 wherein a charge pump is configured to provide the first bi-directional power supply signal.

17. The circuitry of claim 16 wherein the charge pump is further configured to use two flying capacitive elements to provide the first bi-directional power supply signal.

18. The circuitry of claim 1 wherein the plurality of linear amplifier power supply signals further includes a uni-directional power supply signal.

19. The circuitry of claim 18 wherein the uni-directional power supply signal has a DC source voltage and the first bi-directional power supply signal has a voltage, which is equal to about one-half of the DC source voltage.

20. The circuitry of claim 18 wherein a battery is configured to provide the uni-directional power supply signal.

21. The circuitry of claim 18 wherein the plurality of linear amplifier power supply signals consists of the first bi-directional power supply signal and the uni-directional power supply signal.

22. The circuitry of claim 18 wherein the at least the first bi-directional power supply signal consists of the first bi-directional power supply signal.

23. The circuitry of claim 1 further comprising a linear amplifier power supply configured to provide the first bi-directional power supply signal and at least partially functions as a reciprocal two-port network.

24. The circuitry of claim 1 wherein:
the linear amplifier further has a bi-directional power supply input and a uni-directional power supply input;
the plurality of linear amplifier power supply signals further includes a uni-directional power supply signal; and
the linear amplifier is configured to:
receive the first bi-directional power supply signal via the bi-directional power supply input;
receive the uni-directional power supply signal via the uni-directional power supply input;
provide a linear amplifier output current via the linear amplifier output; and
at least partially provide the envelope power supply voltage via the linear amplifier output.

25. The circuitry of claim 24 wherein the output amplifier stage comprises:
a first sinking transistor element coupled between the linear amplifier output and a ground, and configured to substantially sink the linear amplifier output current;
a first sourcing transistor element coupled between the linear amplifier output and the uni-directional power supply input, and configured to substantially source the linear amplifier output current;
a second sinking transistor element coupled between the linear amplifier output and the bi-directional power supply input, and configured to substantially sink the linear amplifier output current; and
a second sourcing transistor element coupled between the linear amplifier output and the bi-directional power supply input, and configured to substantially source the linear amplifier output current.

26. The circuitry of claim 25 wherein the input amplifier stage is further configured to provide a plurality of control signals to the output amplifier stage, such that each of the first sinking transistor element, the first sourcing transistor element, the second sinking transistor element, and the second sourcing transistor element is further configured to receive a corresponding one of the plurality of control signals.

27. A method comprising:
at least partially providing an envelope power supply voltage to a radio frequency (RF) power amplifier (PA) via an envelope power supply output using a selected one of a plurality of linear amplifier power supply signals, such that the plurality of linear amplifier power supply signals includes at least a first bi-directional power supply signal; and selecting the one of the plurality of linear amplifier power supply signals based on the envelope power supply voltage and a setpoint of the envelope power supply voltage, such that an input amplifier stage and an output amplifier stage form a linear amplifier, which has a linear amplifier output.

* * * * *